US012009567B2

(12) United States Patent
Sugawara et al.

(10) Patent No.: US 12,009,567 B2
(45) Date of Patent: Jun. 11, 2024

(54) DIRECTIONAL COUPLER, RADIO COMMUNICATION DEVICE, AND CONTROL METHOD

(71) Applicant: SONY SEMICONDUCTOR SOLUTIONS CORPORATION, Kanagawa (JP)

(72) Inventors: Yoshiki Sugawara, Kanagawa (JP); Yukihito Iida, Kanagawa (JP); Satoshi Suda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 295 days.

(21) Appl. No.: 17/310,978

(22) PCT Filed: Feb. 17, 2020

(86) PCT No.: PCT/JP2020/006007
§ 371 (c)(1),
(2) Date: Sep. 2, 2021

(87) PCT Pub. No.: WO2020/189130
PCT Pub. Date: Sep. 24, 2020

(65) Prior Publication Data
US 2022/0140462 A1    May 5, 2022

(30) Foreign Application Priority Data

Mar. 18, 2019   (JP) ................................ 2019-049313

(51) Int. Cl.
*H01P 5/18* (2006.01)
*H01P 5/02* (2006.01)
(Continued)

(52) U.S. Cl.
CPC ................ *H01P 5/184* (2013.01); *H01P 5/02* (2013.01); *H03H 7/48* (2013.01); *H04B 1/44* (2013.01)

(58) Field of Classification Search
CPC .... H03H 7/48; H04B 1/44; H01P 5/02; H01P 5/102; H01P 5/184
See application file for complete search history.

(56) References Cited

U.S. PATENT DOCUMENTS

2011/0057746 A1    3/2011  Yamamoto et al.
2013/0027273 A1    1/2013  Kuwajima et al.
(Continued)

FOREIGN PATENT DOCUMENTS

CN    102903994 A    1/2013
CN    107210762 A    9/2017
(Continued)

OTHER PUBLICATIONS

International Search Report and Written Opinion of PCT Application No. PCT/JP2020/006007, dated May 12, 2020, 09 pages of ISRWO.

*Primary Examiner* — Patrick C Chen
(74) *Attorney, Agent, or Firm* — CHIP LAW GROUP

(57) ABSTRACT

A directional coupler is provided that includes a primary line that transmits signals from a first terminal to a second terminal; a secondary line that gets coupled with the primary line and draws some of the signals into a third terminal; a first switching unit that switches the connection destination of the third terminal between one end of the secondary line and the other end thereof; a first impedance regulating unit that is installed in between one end of the secondary line and the ground, and that changes the impedance according to the frequency of the signals; a second impedance regulating unit that is installed in between the other end of the secondary line and the ground, and changes the impedance according (Continued)

to the frequency of the signals; and a resonance circuit that is installed in between the first switching unit and the third terminal, and that changes the impedance of the third terminal according to the frequency of the signals.

18 Claims, 28 Drawing Sheets

(51) Int. Cl.
    *H03H 7/48*     (2006.01)
    *H04B 1/44*     (2006.01)

(56) References Cited

U.S. PATENT DOCUMENTS

| | | |
|---|---|---|
| 2015/0180112 A1 | 6/2015 | Kuwajima et al. |
| 2016/0065167 A1 | 3/2016 | Granger-Jones |
| 2017/0310355 A1 | 10/2017 | Hayakawa |
| 2018/0048046 A1* | 2/2018 | Noguchi .................. H03H 7/48 |
| 2019/0140685 A1 | 5/2019 | Hayakawa |
| 2019/0237842 A1 | 8/2019 | Noguchi et al. |

FOREIGN PATENT DOCUMENTS

| | | |
|---|---|---|
| CN | 107431264 A | 12/2017 |
| CN | 109417215 A | 3/2019 |
| DE | 102010040290 A1 | 3/2011 |
| EP | 2551952 A2 | 1/2013 |
| JP | 2011-061440 A | 3/2011 |
| JP | 2013-046305 A | 3/2013 |
| WO | 2016/121455 A1 | 8/2016 |
| WO | 2016/158314 A1 | 10/2016 |

* cited by examiner

FIG.4

| STATE | ACTIVE PATH | F1 | F2 | F3a/F3b | F4a/F4b | F5 | F6 | F7 | F8 | F9 | F10 | F11 | F12 | F13 |
|---|---|---|---|---|---|---|---|---|---|---|---|---|---|---|
| 1 | LB (REVERSE) | L | H | H | L | L | L | H | L | L | L | L | L | L |
| 2 | HB (REVERSE) | L | H | L | H | L | H | L | L | L | L | H | L | L |
| 3 | UHB (REVERSE) | L | H | L | H | H | L | L | L | L | L | L | H | L |
| 4 | LB (FORWARD) | H | L | H | L | L | L | L | H | L | L | L | L | L |
| 5 | HB (FORWARD) | H | L | L | H | L | L | L | L | H | L | H | L | L |
| 6 | UHB (FORWARD) | H | L | L | H | L | L | L | L | L | H | L | H | L |
| 7 | TERM | L | L | L | L | L | L | L | L | L | L | L | L | H |

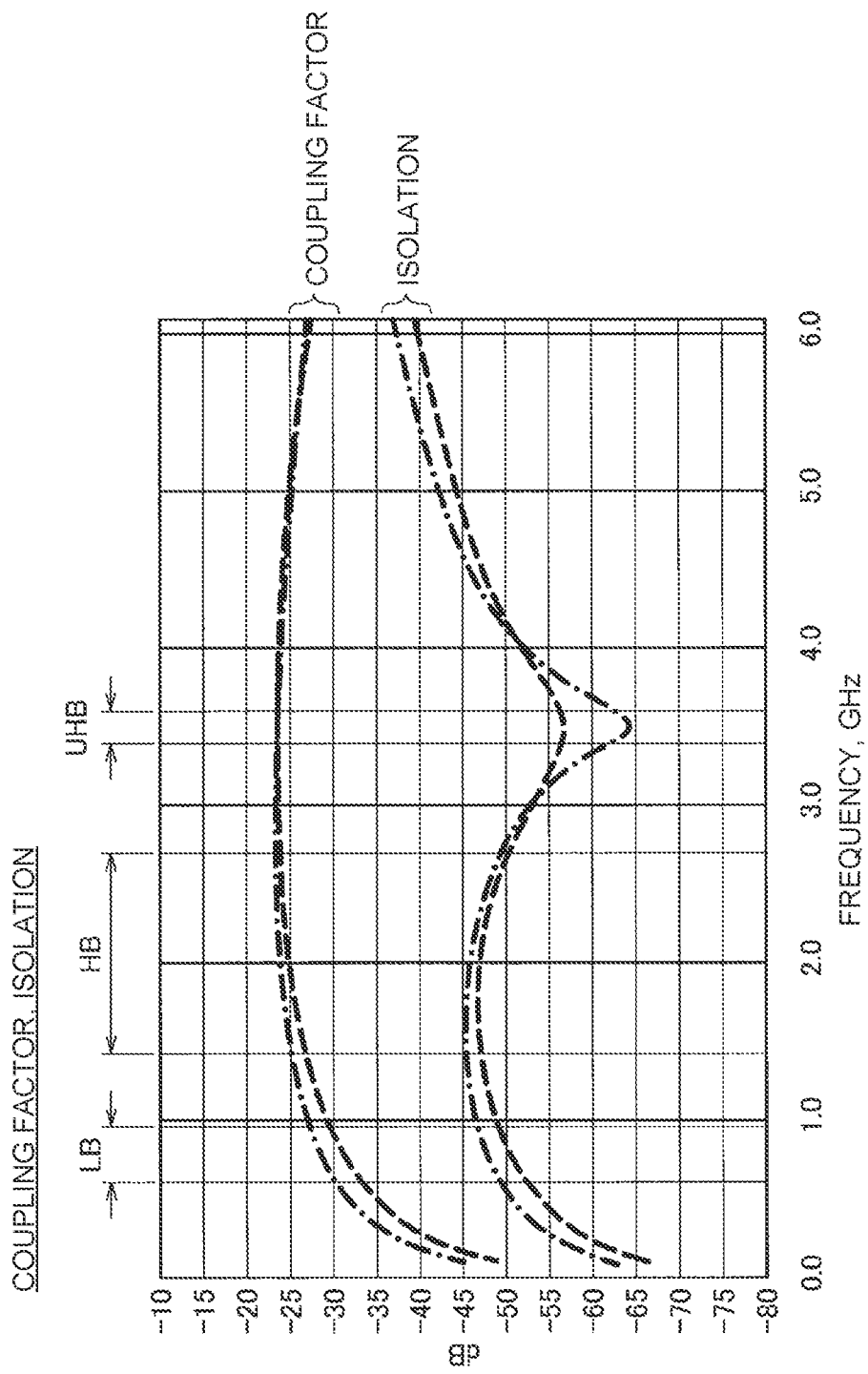

DIRECTIONAL COUPLER, RADIO COMMUNICATION DEVICE, AND CONTROL METHOD

CROSS REFERENCE TO RELATED APPLICATIONS

This application is a U.S. National Phase of International Patent Application No. PCT/JP2020/006007 filed on Feb. 17, 2020, which claims priority benefit of Japanese Patent Application No. JP 2019-049313 filed in the Japan Patent Office on Mar. 18, 2019. Each of the above-referenced applications is hereby incorporated herein by reference in its entirety.

FIELD

The application concerned is related to a directional coupler, a radio communication device, and a control method.

BACKGROUND

In a radio communication device such as a handheld terminal; for example, in order to detect the signal level of the transmission signals emitted from an antenna, a directional coupler is installed in between the antenna and a power amplifier, and some of the transmission signals are drawn using the directional coupler. More specifically, the directional coupler includes a primary line and a secondary line that undergo coupling when installed close to each other; an input port from which transmission signals are input is installed at one end of the primary line; and an output port from which transmission signals are output is installed at the other end of the primary line. Moreover, a coupler port meant for drawing some of the transmission signals for detection purposes is installed at one end of the secondary line; and an isolation port is installed at the other end of the secondary line. An example of such a directional coupler is disclosed in Patent Literature 1 mentioned below.

CITATION LIST

Patent Literature

Patent Literature 1: International Laid-open Pamphlet No. 2016/158314

SUMMARY

Technical Problem

The main characteristics that indicate the performance of a directional coupler include insertion loss, coupling factor (coupling characteristic), isolation, return loss, and directivity. However, in the studies about conventional directional couplers, there has been no discussion focused on the return loss. Hence, in conventional directional couplers, there is a limitation on enhancing the return loss characteristics.

In that regard, in the application concerned, a directional coupler, a radio communication device, and a control method in a new and enhanced form are proposed that enable further enhancement in the return los characteristics.

Solution to Problem

According to the present disclosure, a directional coupler is included that includes: a primary line that transmits signals from a first terminal to a second terminal; a secondary line that gets coupled with the primary line and draws some of the signals into a third terminal; a first switching unit that switches connection destination of the third terminal between one end of the secondary line and other end thereof; a first impedance regulating unit that is installed in between one end of the secondary line and ground, and that changes impedance according to frequency of the signals; a second impedance regulating unit that is installed in between other end of the secondary line and the ground, and changes impedance according to frequency of the signals; and a resonance circuit that is installed in between the first switching unit and the third terminal, and that changes impedance of the third terminal according to frequency of the signals.

Moreover, according to the present disclosure, a radio communication device is provided that includes a directional coupler, wherein the directional coupler includes a primary line that transmits signals from a first terminal to a second terminal, a secondary line that gets coupled with the primary line and draws some of the signals into a third terminal, a first switching unit that switches connection destination of the third terminal between one end of the secondary line and other end thereof, a first impedance regulating unit that is installed in between one end of the secondary line and ground, and that changes impedance according to frequency of the signals, a second impedance regulating unit that is installed in between other end of the secondary line and the ground, and changes impedance according to frequency of the signals, and a resonance circuit that is installed in between the first switching unit and the third terminal, and that changes impedance of the third terminal according to frequency of the signals.

Furthermore, according to the present disclosure, a control method for a directional coupler is provided that includes a primary line that transmits signals from a first terminal to a second terminal, a secondary line that gets coupled with the primary line and draws some of the signals into a third terminal, a first switching unit that switches connection destination of the third terminal between one end of the secondary line and other end thereof, a first impedance regulating unit that is installed in between one end of the secondary line and ground, and that changes impedance according to frequency of the signals, a second impedance regulating unit that is installed in between other end of the secondary line and the ground, and changes impedance according to frequency of the signals, and a resonance circuit that is installed in between the first switching unit and the third terminal, and that changes impedance of the third terminal according to frequency of the signals, the control method including regulating the first impedance regulating unit, the second impedance regulating unit, and the resonance circuit according to frequency of the signals.

BRIEF DESCRIPTION OF DRAWINGS

FIG. 4 is an explanatory diagram for explaining an example of operations of the coupler module 140 according to the embodiment.

FIG. 9A is a diagram illustrating the simulation result regarding the coupling factor and the isolation in the ultrahigh-band mode of the coupler module 140 according to the embodiment and a coupler module 140a according to a comparison example.

DESCRIPTION OF EMBODIMENTS

Figure 1:
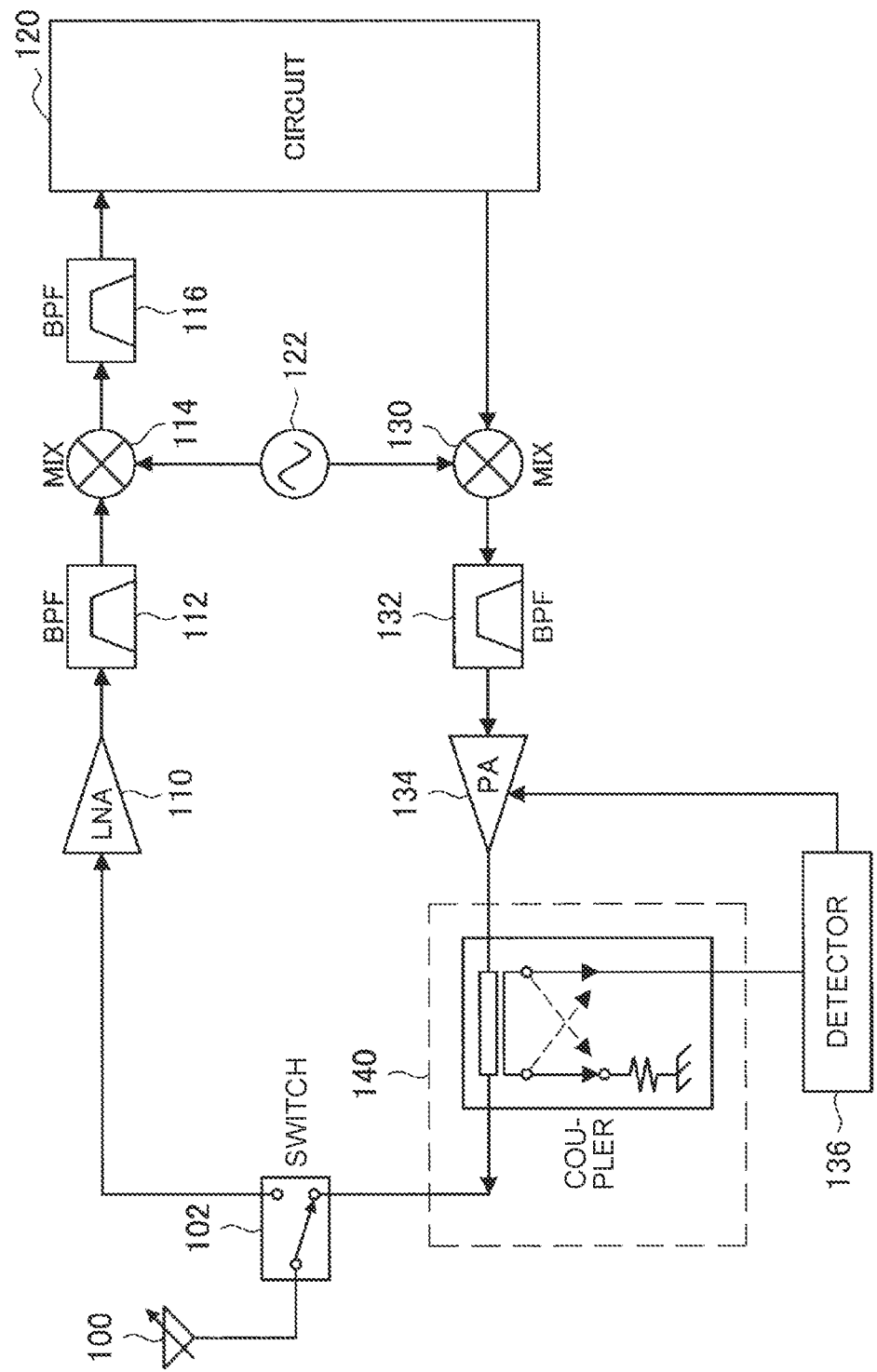
FIG. 1 is an explanatory diagram for explaining an exemplary configuration of a radio communication device 10 according to an embodiment.

A preferred embodiment of the application concerned is described below in detail with reference to the accompanying drawings. In the present written description and the drawings, the constituent elements having practically identical functional configuration are referred to by the same reference numerals, and the explanation is not given repeatedly.

Moreover, in the present written description and the drawings, a plurality of constituent elements having practically identical or similar functional configurations is sometimes distinguished from each other by attaching different numeric characters to the same reference numerals. However, when a plurality of constituent elements having practically identical or similar functional configurations need be particularly distinguished from each other, only the same reference numeral is used. Furthermore, regarding similar constituent elements among different embodiments, sometimes different alphabets are attached to the same reference numeral. However, when those similar constituent elements need not be distinguished from each other, only the same reference numeral is used.

Moreover, in the following explanation about circuit configurations, unless specified otherwise, "connection" implies electrical connection among a plurality of elements.

Furthermore, "connection" mentioned in the following explanation not only includes direct and electrical connection among a plurality of elements but also includes indirect connection via other elements.

The explanation is given in the following sequence.
1. Embodiment of application concerned
 1.1 Example of radio communication device 10 according to embodiment of application concerned
 1.2 Example of coupler 150 according to embodiment of application concerned
 1.3 Background factors behind formation of embodiment of application concerned by inventors
 1.4 Exemplary configuration of coupler module 140 according to embodiment of application concerned
 1.5 Exemplary operations of coupler module 140 according to embodiment of application concerned 1.6 Simulation result for coupler module 140 according to embodiment of application concerned
1.7 Modification examples
1.8 Summary
2. Application examples of embodiment of application concerned
  2.1 Radio communication
    2.1.1. Application example regarding control entity
    2.1.2. Application examples regarding base station
    2.1.3. Application examples regarding handheld terminal
  2.2 Vehicle control system
3. Supplementary explanation <<1. Embodiment of Application Concerned>>

<1.1 Example of Radio Communication Device 10 According to Embodiment of Application Concerned>

Firstly, explained below with reference to FIG. 1 is an example of a radio communication device 10 according to the embodiment of the application concerned. FIG. 1 is an explanatory diagram for explaining an exemplary configuration of the radio communication device 10 according to the embodiment.

As illustrated in FIG. 1, the radio communication device 10 according to the embodiment includes an antenna 100 for receiving signals, and a switch 102 for switching between transmission and reception. Moreover, the radio communication device 10 includes a low noise amplifier (LNA) 110 that amplifies the input signals input to the antenna 100; band pass filters (BPFs) 112 and 116 that selectively transmit the signals of desired frequencies; and a mixer (MIX) 114 that converts the frequencies of the input signals. Furthermore, the radio communication device 10 includes a control circuit (circuit) 120 that controls the blocks of the radio communication device 10 and demodulates the received signals; and an oscillator 122 that generates local oscillation signals having the desired frequency. Moreover, the radio communication device 10 includes a mixer 130 that converts the frequency of the transmission signals; a BPF 132; a power amplifier (PA) 134 that amplifies the transmission signals; and a measuring unit (detector) 136 that detects the signal level of the transmission signals. Furthermore, the radio communication device 10 includes a coupler module (a directional coupler) 140 that distributes the transmission signals to the antenna 100 and the measuring unit 136. Given below is the explanation of the blocks of the radio communication device 10 according to the embodiment.

(Antenna 100)

The antenna 100 is configured with, for example, a chip antenna; and receives electromagnetic waves (received signals) propagating in the space, and inputs the received signals to the LNA 110 (described later) via the switch 102 (described later). Moreover, via the coupler module 140 (described later) and the switch 102, the antenna 100 radiates transmission signals from the PA 134 (described later) into the space. Meanwhile, according to the embodiment, since a plurality of frequency bands is used, the radio communication device 10 can include a plurality of antennas 100 corresponding to those frequency bands. In that case, the radio communication device 10 can include an antenna switch (not illustrated) that enables switching among the antennas 100 to be used.

(Switch 102)

The switch 102 is configured with, for example, a semiconductor device or a resistive element; includes a single antenna-side port (not illustrated), a single transmission port (not illustrated), and a single reception port (not illustrated); and is capable of selectively switching between the transmission port and the reception port as the port to be electrically connected to the antenna-side port. As illustrated in FIG. 1, the PA 134 that performs radio signal transmission is connected to the transmission port of the switch 102 via the coupler module 140. Moreover, the LNA 110 that performs radio signal reception is connected to the reception port of the switch 102.

(LNA 110)

The LNA 110 is configured with a semiconductor device such as a transistor; is connected to the switch 102; and is capable of amplifying the received signals coming from the antenna 100 via the switch 102. Then, the received signals that are amplified by the LNA 110 are output to the BPF 112 (described below).

(BPF 112)

The BPF 112 is configured with an element such as a resistor, a capacitor, or an inductor; and is connected to the LNA 110. The BPF 112 is capable of selectively transmitting the signals that, from among the signals received by the antenna 100, have the frequencies in a predetermined frequency band which includes the frequencies of the signals that would be processed in the radio communication device 10; and is capable of attenuating the signals having the frequencies outside the predetermined frequency band. The signals that pass through the BPF 112 are then output to the mixer 114 (described below).

(Mixer 114)

The mixer 114 is configured with a plurality of semiconductor devices such as transistors; is connected to the BPF 112; and is capable of converting the signals input from the BPF 112 into signals having a lower frequency. More specifically, the mixer 114 can multiply the input received signals with local oscillation signals coming from the oscillator 122 (described later), and can obtain the signals having the frequencies corresponding to the sum and the difference of the frequency of the received signals and the frequency of the local oscillation signals. The signals obtained by frequency conversion by the mixer 114 are then input to the control circuit 120 via the BPF 116 (described below).

(BPF 116)

The BPF 116 is connected to the mixer 114; selectively allows passage of the signals having the frequency corresponding to the difference between the frequency of the received signals and the frequency of the local oscillation signals; and outputs those signals to the control circuit 120 (described below).

(Control Circuit 120)

The control circuit 120 can be configured with an arithmetic logical operation element such as a DSP (Digital Signal Processor), or an FPGA (Field-Programmable Gate Array), or a microcomputer. The control circuit 120 is capable of generating transmission signals and demodulate the received signals that are output from the BPF 116.

(Oscillator 122)

The oscillator 122 is configured with, for example, a crystal oscillator (not illustrated), a phase comparator (not illustrated), a frequency divider (not illustrated), a charge pump (not illustrated), and a PLL (Phase Locked Loop) synthesizer having a loop filter (not illustrated); and is connected to the mixer 114 and the mixer 130 (described later). The oscillator 122 generates, with accuracy and stability, local oscillation signals having the desired frequency, and outputs the local oscillation signals to the mixers 114 and 130.

(Mixer 130)

The mixer 130 is capable of converting the transmission signals output from the control circuit 120 into, for example, signals having a higher frequency. The transmission signals obtained by frequency conversion by the mixer 130 are then input to the PA 134 via the BPF 132 (described below).

(BPF 132)

The BPF 132 is connected to the mixer 130; selectively allows passage of the signals having the frequency corresponding to the sum of the frequency of the transmission signals and the frequency of local oscillation signals; and outputs those signals to the PA 134 (described below).

(PA 134)

The PA 134 is configured with a semiconductor device such as a transistor; is connected to the BPF 132; and is capable of amplifying the signals that pass through the BPF 132. The signals amplified by the PA 134 are output to the coupler module 140 (described later).

(Measuring Unit 136)

The measuring unit 136 is connected to a port P3 (see FIG. 3) of the coupler module 140 (described below); detects the signal level of the transmission signals; and supplies control signals based on the detection result to the PA 134 via a control unit (not illustrated). According to the control signals, the PA 134 becomes able to regulate the degree of amplification of the transmission signals.

(Coupler Module 140)

The coupler module 140 is connected to the PA 134, and distributes the transmission signals coming from the PA 134 to the antenna 100 and the measuring unit 136. More specifically, the coupler module 140 includes a coupler 150 and a regulator circuit 200; and the regulator circuit 200 has a plurality of switches (not illustrated) for switching the transmission mode. The switching operations of those switches are controlled from the control circuit 120 or an external controller (not illustrated). Regarding the detailed configuration of the coupler module 140 according to the embodiment, the explanation is given later.

<1.2 Example of Coupler 150 According to Embodiment of Application Concerned>

Figure 2:
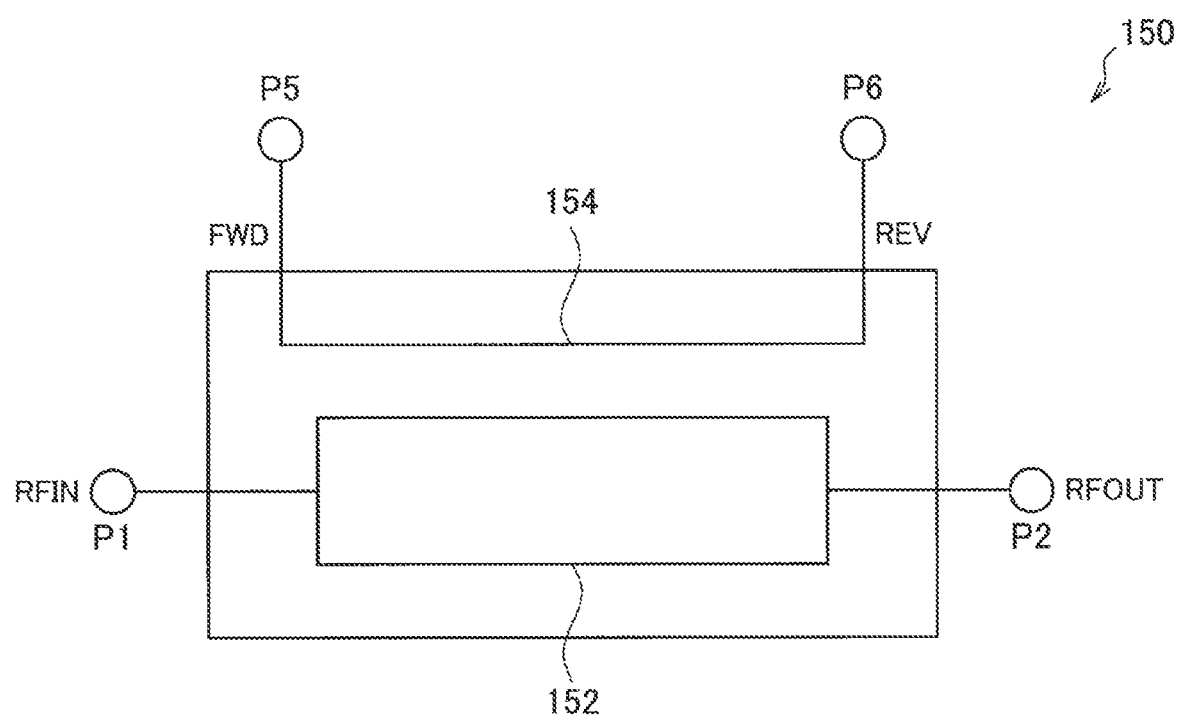
FIG. 2 is a diagram illustrating an exemplary configuration of a coupler 150 according to the embodiment.

Till now, the explanation was given about an example of the radio communication device 10 according to the embodiment. Explained below with reference to FIG. 2 is an example of the coupler 150 included in the coupler module 140 according to the embodiment of the application concerned. FIG. 2 is a diagram illustrating an exemplary configuration of the coupler 150 according to the embodiment.

As illustrated in FIG. 2, the coupler 150 includes a microstrip line 152 representing the primary line, and includes a microstrip line 154 representing the secondary line. The microstrip lines 152 and 154 can be installed close to each other, so that coupling (electromagnetic coupling) occurs therebetween.

As illustrated in FIG. 2, the left end (one end) of the microstrip line 152 is connected to a port P1 (a first terminal) representing the input port for transmission signals. The port P1 is connected to the PA 134. Moreover, the right end (the other end) of the microstrip line 152 is connected to a port P2 (a second terminal) representing the output port for transmission signals. The port P2 is connected to the antenna 100.

The two ends of the microstrip line 154 are connected to ports P5 and P6. One of the ports P5 and P6 is connected to a port P3 (a third terminal) (see FIG. 3), which outputs transmission signals to the measuring unit 136, via a coupling planarization unit 32 (see FIG. 3). The other port among the ports P5 and P6 is connected to the ground via a terminal part 30 (see FIG. 3). For example, when transmission signals are input to the port P1, they are carried to the port P2 via the microstrip line 152. Moreover, some of the transmission signals are carried to the microstrip line 154 due to coupling; and, depending on the transmission mode, are carried to the port P5 or the port P6. Then, the transmission signals are output to the port P3 (see FIG. 3) from one of the ports P5 and P6.

Meanwhile, as explained earlier, the main characteristics that indicate the performance of the coupler module 140 include insertion loss, coupling factor, isolation, return loss, and directivity.

More specifically, the insertion loss implies the loss occurring due to the coupler module 140, and represents the ratio of the signal level of the transmission signals input to the input port P1 and the signal level of the transmission signals output to the output port P2. It is desirable that the insertion loss is small.

The coupling factor implies the extent to which the transmission signals in the forward direction, which are carried from the input port P1 to the output port P2, are drawn at the port P3; and represents the ratio of the signal level of the transmission signals input to the input port P1 and the signal level of the transmission signals (CF signals) output to the port P3. Meanwhile, in order to control the PA 134 with accuracy, it is required to accurately measure the power level of the transmission signals. That is, even if there is some variation in the frequency of the transmission signals, the transmission signals (CF signals) drawn from the port P3 need to have a stable signal level. Hence, it is desirable that the coupling factor has flatness regarding the frequency dependence in the desired frequency range.

The isolation implies the extent of leakage of the reverse signals, which are carried from the output port P2 to the input port P1, to an isolation port (according to the embodiment, to one of the ports P5 and P6 (see FIG. 3)); and represents the ratio of the signal level of the signals input to the input port P1 and the signal level of the reverse signals (ISO signals) output to the isolation port. It is desirable that the leakage is small.

Regarding the return loss at the port P3, when signals are input to the port P3, the return loss implies the extent to which the signals return to the P3 due to reflection attributed to insufficient impedance matching. That is, the return loss implies the reflection loss. It is desirable that the return loss is small.

The directivity represents the ratio of the signal level of the transmission signals (CF signals) output to the port P3 and the signal level of the reverse signals (ISO signals) output to the isolation port. Thus, the directivity implies the extent of separation of the forward signals and the reverse signals. It is desirable that the directivity is high.

<1.3 Background Factors Behind Formation of Embodiment of Application Concerned by Inventors>

Figure 19:
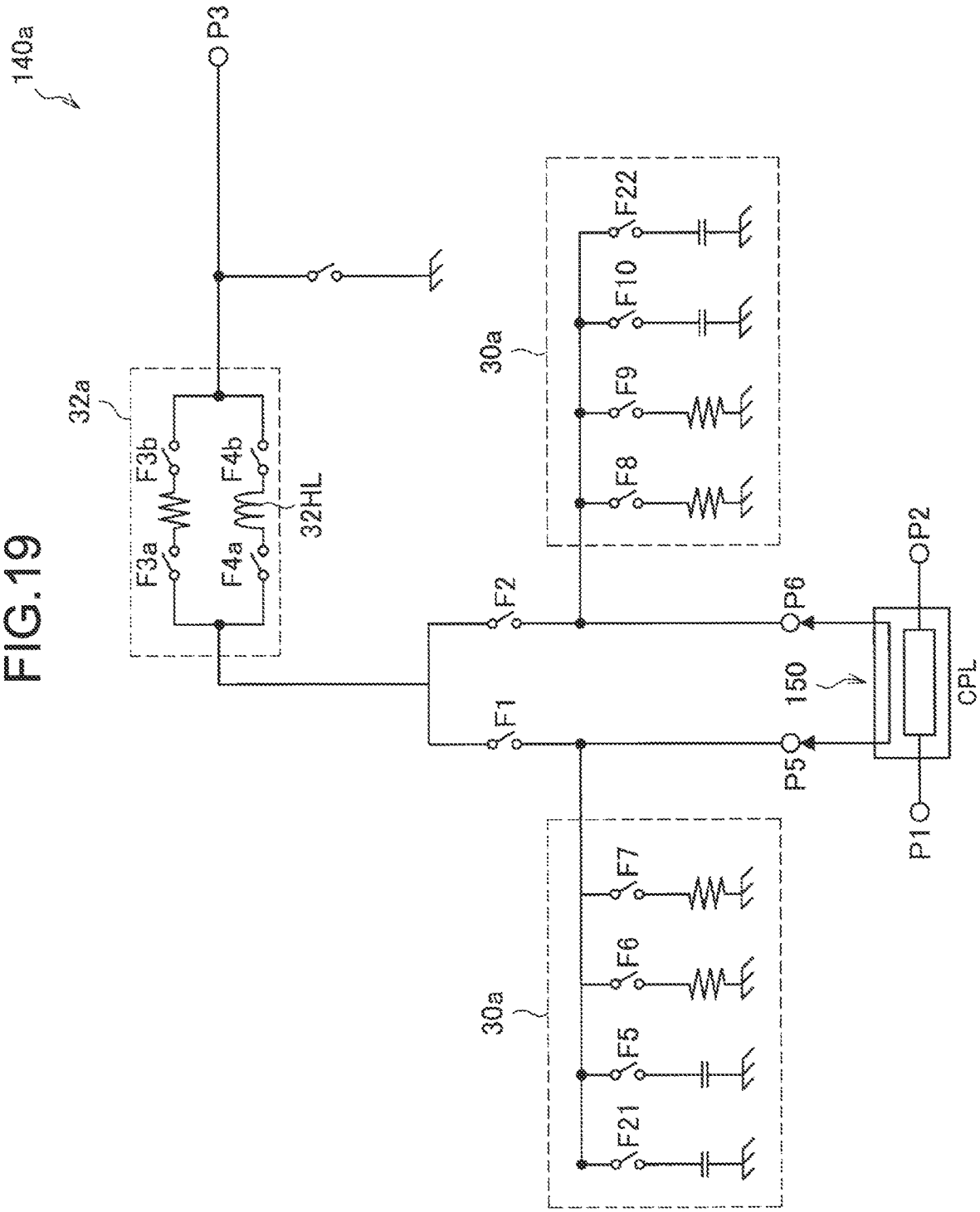
FIG. 19 is an explanatory diagram for explaining an exemplary configuration of the coupler module 140a according to the comparison example.

Till now, the explanation was given about an example of the coupler 150 included in the coupler module 140 according to the embodiment. Subsequently, prior to the specific explanation about the coupler module 140 according to the embodiment, explained below with reference to FIG. 19 are the background factors that were behind the formation of the embodiment of the application concerned by the inventors. FIG. 19 is an explanatory diagram for explaining an exemplary configuration of a coupler module 140a according to a comparison example. The comparison example points to a configuration of the coupler module that was being exhaustively studied by the inventors before forming the embodiment of the application concerned.

Meanwhile, in a cellular phone system, high-frequency signals of a plurality of different frequency bands are used. Hence, the coupler module 140 used in the radio communication device 10 related to such a cellular phone system is required to fulfil the desired characteristics in a plurality of different frequency bands.

In that regard, the inventors of the application concerned were earnestly studying about the coupler module 140a according to the comparison example illustrated in FIG. 19. As illustrated in FIG. 19, the coupler module 140a according to the comparison example includes a plurality of switches F5 to F10, F21, and F22 for enabling changing the isolation to the desired state according to the frequency band to be used. Moreover, the coupler module 140a includes terminal parts 30a that get connected to the coupler 150 due to the switching of the switches F5 to F10, F21, and F22. Herein, the switches F5 to F10, F21, and F22 can be implemented using, for example, FETs (Field Effect Transistors). In the comparison example, in the terminal parts 30a, the resistor (not illustrated) and the capacitor (not illustrated) are selected according to the frequency band to be used, so that the isolation and the directivity is in the desired state in each frequency band. Furthermore, the coupler module 140a includes a coupling planarization unit 32a that has an inductor 32HL for planarizing the frequency dependence of the coupling factor in the frequency band to be used. More specifically, in the comparison example, switching is performed among switches F3a, F3b, F4a, and F4b; and the frequency dependence of the coupling factor is planarized in the frequency band to be used.

However, according to the result of the earnest study undertaken by the inventors, in the coupler module 140a according to the comparison example, it became clear that there is a limit to enhancing the return loss at the port P3. More specifically, in the coupler module 140a according to the comparison example, at the port P3, a matching circuit is absent that would match to 50 ohms according to the frequency band to be used. Since a matching circuit is absent, in the comparison example, the nonmatching of the port P3 causes reflection of signals at the port boundary, and thus the transmission signals cannot be efficiently drawn from the microstrip line 154.

Hence, from the study done by the inventors, when the coupler module 140a according to the comparison example was used, it was understood that accurate measurement of the power level of the transmission signals was a difficult task to perform using the measuring unit 136, and in turn performing accurate control of the PA 134 was sometimes difficult.

In that regard, in such a situation, the inventors came up with the embodiment of the application concerned as described below. In the coupler module 140 according to the embodiment of the application concerned, a matching regulator unit is installed for matching to 50 ohms according to the frequency band to be used, thereby enabling achieving further enhancement in the return loss characteristics. Given below is the sequential explanation of the details of the embodiment of the application concerned as formed by the inventors.

<1.4 Exemplary Configuration of Coupler Module 140 According to Embodiment of Application Concerned>

Figure 3:
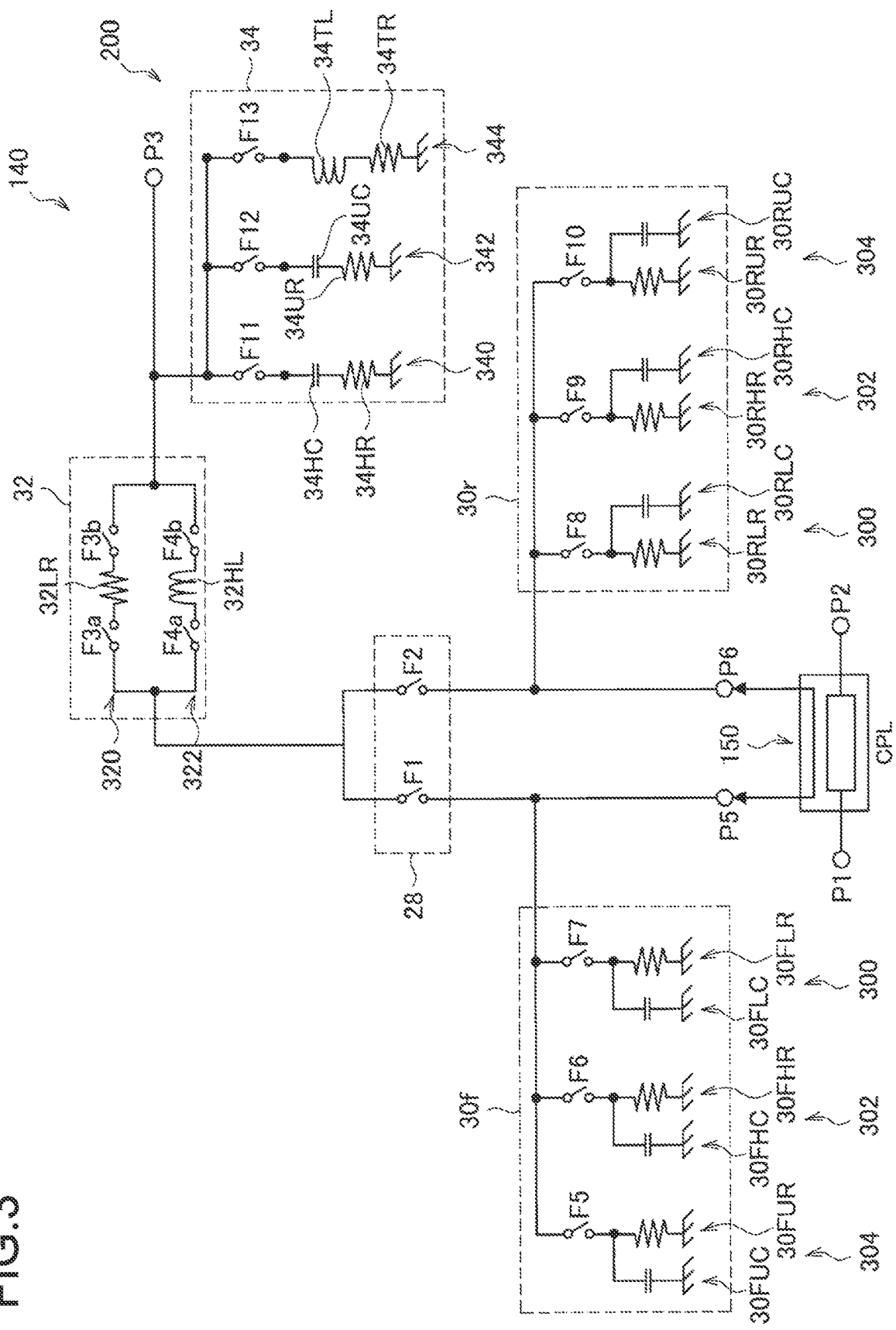
FIG. 3 is an explanatory diagram for explaining an exemplary configuration of a coupler module 140 according to the embodiment.

Explained below with reference to FIG. 3 is an exemplary configuration of the coupler module 140 according to the embodiment of the application concerned. FIG. 3 is an explanatory diagram for explaining an exemplary configuration of the coupler module 140 according to the embodiment.

As illustrated in FIG. 3, the coupler module 140 includes the coupler 150 and the regulator circuit 200. Given below is the explanation of the coupler 150 and the regulator circuit 200 according to the embodiment.

(Coupler 150)

As explained earlier, the coupler 150 includes the microstrip line 152 representing the primary line, and includes the microstrip line 154 representing the secondary line. More specifically, the left end of the microstrip line 152 is connected to the port P1, and the port P1 is connected to the PA 134. The right end of the microstrip line 152 is connected to the port P2, and the port P2 is connected to the antenna 100. The two ends of the microstrip line 154 are connected to the ports P5 and P6. One of the ports P5 and P6 is connected to the port P3, which outputs transmission signals to the measuring unit 136, via the coupling planarization unit 32 of the regulator circuit 200. The other port among the ports P5 and P6 is connected to the ground via terminal parts 30f and 30r of the regulator circuit 200.

(Regulator Circuit 200)

As explained earlier, the regulator circuit 200 is connected to the ports P5 and P6 of the coupler 150, and is capable of regulating the characteristics such as isolation and return loss to be in the desired state according to the frequency band to be used. More specifically, as illustrated in FIG. 3, the regulator circuit 200 includes a switching unit (a first switching unit) 28; the terminal parts (impedance regulating units) 30f and 30r; and a resonance circuit made of the coupling planarization unit 32 and a matching regulator unit 34. Given below is the explanation of each circuit block included in the regulator circuit 200 according to the embodiment.

~Switching Unit 28~

The switching unit 28 is made of a plurality of switches F1 and F2; is connected to the ports P5 and P6 at the two ends of the microstrip line 154 of the coupler 150; and is capable of switching the connection destination of the port P3 between the ports P5 and P6.

~Terminal Part 30~

The terminal part 30 includes two terminal parts, namely, the terminal part 30f (a first impedance regulating unit) and the terminal part 30r (a second impedance regulating unit), and is capable of regulating isolation. More specifically, the terminal part 30f is installed in between the port P5 and the ground, and is capable of regulating isolation by changing the impedance according to the frequency band to be used. The terminal part 30r is installed in between the port P6 and the ground, and is capable of regulating isolation by changing the impedance according to the frequency band to be used. More particularly, the terminal part 30r can ensure that the return signals of the signals input to the terminal part 30r on the side of the port P6 via the input port P1 have the opposite phase to the phase of the reverse signals (ISO signals) output to the port P5, and thus enables cancelation of the ISO signals by the return signals. As a result, according to the embodiment, the terminal part 30r enables achieving further enhancement in the isolation. Meanwhile, according to the embodiment, the terminal part 30 can be alternatively connected to only one of the ports P5 and P6. Thus, there is no particular restriction in that regard.

More particularly, each of the terminal parts 30f and 30r includes the following: a terminal part (a first regulating part) 300 corresponding to the transmission signals having the frequencies in a low band (a first frequency band) (for example, in the range from 620 MHz to 960 MHz); a terminal part (a second regulating part) 302 corresponding to the transmission signals having the frequencies in a high band (a second frequency band) (for example, in the range from 1430 MHz to 2690 MHz); and a terminal part (a third regulating part) 304 corresponding to the transmission signals having the frequencies in an ultrahigh band (a third frequency band) (for example, in the range from 3400 MHz to 3600 MHz). Moreover, the terminal parts 30f and 30r include the switches F5 to F10 (fourth switching units) for switching the connection destination of the ports P5 and P6 among the terminal parts 300, 302, and 304.

More particularly, each of the terminal parts 300, 302, and 304 includes at least either a resistor, or an inductor, or a capacitor; and is capable of connecting the ports P5 and P6 to the ground via those elements. In the example illustrated in FIG. 3, each of the terminal parts 300, 302, and 304 includes resistors 30FLR, 30FHR, 30FUR, 30RLR, 30RHR, 30RUR that are connected in parallel with capacitors 30FLC, 30FHC, 30FUC, 30RLC, 30RHC, and 30RUC, respectively.

According to the embodiment, depending on the frequency band to be used, the terminal part to be connected to the ports P5 and P6 is switched among the terminal parts 300, 302, and 304. As a result of such switching, the phase of the return signals of the signals input to the terminal part 30r, which is on the side of the port P6 among the ports P5 and P6, via the input port P1 have the opposite phase to the phase of the reverse signals (ISO signals) output to the other port among the ports P5 and P6. As a result, the ISO signals can be cancelled out by the return signals. Hence, according to the embodiment, depending on the frequency band to be used, the isolation can be further enhanced, and in turn the directivity can be further enhanced.

~Resonance Circuit~

The resonance circuit is installed in between the switching unit 28 and the port P3, and is capable of changing the impedance of the port P3 according to the frequency band to be used. More specifically, as illustrated in FIG. 3, the resonance circuit includes the coupling planarization unit 32 that is electrically connected in series in between the switching unit 28 and the port P3; and includes the matching regulator unit 34 that is electrically connected in series in between the switching unit 28 and the port P3. Given below is the explanation about the coupling planarization unit 32 and the matching regulator unit 34.

~~Coupling Planarization Unit 32~~

The coupling planarization unit 32 is capable of performing adjustment to ensure that the frequency dependence of the coupling factor is planarized in the frequency band to be used.

As illustrated in FIG. 3, the coupling planarization unit 32 includes a coupling planarization unit (a first coupling planarization unit) 320 corresponding to the transmission signals having frequencies in a low band. Moreover, the coupling planarization unit 32 includes a coupling planarization unit (a second coupling planarization unit) 322 corresponding to the transmission signals having frequencies in a high band and an ultrahigh band. Furthermore, the coupling planarization unit 32 includes switches F3a, F3b, F4a, and F4b (third switching units) for switching the coupling destination of the port P3 between the coupling planarization units 320 and 322.

More particularly, each of the coupling planarization units 320 and 322 includes at least either a resistor, or an inductor, or an attenuator (ATT). In the example illustrated in FIG. 3, the coupling planarization unit 320 includes a resistor 32LR and is thus capable of regulating the impedance of the port P3 to 50 ohm according to the frequency band to be used. The coupling planarization unit 322 includes the inductor 32HL and is thus capable of performing adjustment to ensure that the frequency dependence of the coupling factor is planarized in each frequency band. Meanwhile, the coupling planarization unit 320 is not limited to have the circuit configuration as illustrated in FIG. 3; and can alternatively have some other circuit configuration as long as the impedance of the port P3 can be regulated to 50 ohm according to the frequency band to be used. Regarding another exemplary circuit configuration, the explanation is given later.

~~Matching Regulator Unit 34~~

The matching regulator unit 34 is installed in between the port P3 and the ground, and is capable of regulating the impedance of the port P3 to 50 ohm according to the frequency band to be used, thereby enabling achieving further enhancement in the return loss.

The matching regulator unit 34 includes a matching regulator unit (a first matching regulator unit) 340 corresponding to the transmission signals having frequencies of a high band; and a matching regulator unit (a second matching regulator unit) 342 corresponding to the transmission signals having frequencies of an ultrahigh band. Moreover, the matching regulator unit 34 includes a ground connecting unit 344 that, in the state in which the coupler module 140 is not being used (in the following explanation, called a termination mode), connects the port P3 to the ground. Furthermore, the matching regulator unit 34 includes switches F11 to F13 (second switching units) for switching the connection destination of the port P3 among the matching regulator unit 340, the matching regulator unit 342, and the ground connecting unit 344.

More particularly, each of the matching regulator unit 340, the matching regulator unit 342, and the ground connecting unit 344 includes at least either a resistor, or an inductor, or a capacitor. In the example illustrated in FIG. 3, the matching regulator unit 340 as well as the matching regulator unit 342 includes resistors 34HR and 34UR that are connected in series to capacitors 34HC and 34UC, respectively. The ground connecting unit 344 includes an inductor 34TL that is connected in series to a resistor 34TR.

Meanwhile, according to the embodiment, the circuit configuration of the terminal parts 300, 302, and 304; the circuit configuration of the coupling planarization units 320 and 322; the circuit configuration of the matching regulator units 340 and 342; and the circuit configuration of the ground connecting unit 344 are not limited to the circuit configurations illustrated in FIG. 3. For example, the circuit configurations can be appropriately changed according to the frequency band to be used or according to the wiring drawing.

<1.5 Exemplary Operations of Coupler Module 140 According to Embodiment of Application Concerned>

In the coupler module 140 explained above according to the embodiment; the terminal part 30, the coupling planarization unit 32, and the matching regulator unit 34 are controlled according to the frequency band to be used. Explained below with reference to FIGS. 3 and 4 is an example of operations (a control method) of the coupler module 140 according to the embodiment. FIG. 4 is an explanatory diagram for explaining an example of operations of the coupler module 140 according to the embodiment.

According to the embodiment, according to the frequency band to be used, the coupler module 140 has three modes, namely, a low-band mode (for example, in the range from 620 MHz to 960 MHz), a high-band mode (for example, in the range from 1430 MHz to 2690 MHz), and an ultrahigh-band mode (for example, in the range from 3400 MHz to 3600 MHz). Moreover, according to the embodiment, the coupler module 140 has a termination mode (TERM) that represents the state in which the coupler module 140 is not being used. According to the embodiment, depending on the mode, a plurality of switches F1, F2, F3a, F3b, F4a, F4b, and F5 to F13 is used for switching among the terminal part 30, the coupling planarization unit 32, and the matching regulator unit 34. Meanwhile, according to the embodiment, in each mode, there is a "forward" state in which coupling signals are drawn at the port P3 according to the travelling waves of the coupler 150 (i.e., the forward signals from the port P1 toward the port P2); and there is a "reverse" state in which coupling signals are drawn at the port P3 according to the reflected waves of the coupler 150 (i.e., the reverse signals from the port P2 to the port P1). With reference to FIGS. 3 and 4, given below is the sequential explanation of the operations of the coupler module 140 in each mode.

(Low-Band Mode)

For example, in the low-band (reverse) mode, as illustrated in the topmost row in FIG. 4, the switch F1 is turned OFF (hereinafter, illustrated as "L" in FIG. 4) and the switch F2 is turned ON (hereinafter, illustrated as "H" in FIG. 4). As a result, in the low-band (reverse) mode, the port P5 of the coupler 150 does not get connected to the port P3, and the port P6 of the coupler 150 gets connected to the port P3. Moreover, in the low-band (reverse) mode, the switches F3a and F3b are turned ON and the switches F4a and F4b are turned OFF. As a result, in the low-band (reverse) mode, the ports P6 and P3 get connected via the coupling planarization unit 320, and the impedance of the port P3 can be regulated to 50 ohm in the frequency band of the low-band mode. Furthermore, in the low-band (reverse) mode, the switches F5 and F6 are turned OFF, and the switch F7 is turned ON. As a result, in the low-band (reverse) mode, the port P5 gets connected to the ground via the terminal part 300. Thus, by ensuring that the return signals of the signals input to the terminal part 300 via the input port P1 have the opposite phase to the phase of the reverse signals (ISO signals) output to the port P6, the terminal part 300 enables cancelation of the ISO signals by the return signals. Hence, in the low-band (reverse) mode, according to the embodiment, the terminal part 300 enables achieving further enhancement in the isolation, and in turn enables achieving further enhancement in the directivity. Meanwhile, herein, the switches F8 to F10 are turned OFF. Moreover, the switches F11 to F13 are turned OFF.

(High-Band Mode)

For example, in the high-band (reverse) mode, as illustrated in the second row from top in FIG. 4, the switch F1 is turned OFF and the switch F2 is turned ON. As a result, in the high-band (reverse) mode, the port P5 of the coupler 150 does not get connected to the port P3, and the port P6 of the coupler 150 gets connected to the port P3. Moreover, in the high-band (reverse) mode, the switches F3a and F3b are turned OFF and the switches F4a and F4b are turned ON. As a result, in the high-band (reverse) mode, the ports P6 and P3 get connected via the coupling planarization unit 322 and adjustment can be performed in such a way that the frequency dependence of the coupling factor is planarized in the frequency band in the high-band mode. Furthermore, in the high-band (reverse) mode, the switches F5 and F7 are turned OFF, and the switch F6 is turned ON. As a result, in the high-band (reverse) mode, the port P5 gets connected to the ground via the terminal part 302. Thus, by ensuring that the return signals of the signals input to the terminal part 302 via the input port P1 have the opposite phase to the phase of the reverse signals (ISO signals) output to the port P6, the terminal part 302 enables cancelation of the ISO signals by the return signals. Hence, in the high-band (reverse) mode, the terminal part 302 enables achieving further enhancement in the isolation, and in turn enables achieving further enhancement in the directivity. At that time, the switches F8 to F10 are turned OFF. Moreover, in the high-band (reverse) mode, the switch F11 is turned ON, and the switches F12 and F13 are turned OFF. As a result, in the high-band (reverse) mode, the port P3 gets connected to the ground via the matching regulator unit 340 and the impedance of the port P3 is regulated to 50 ohm, thereby enabling achieving further enhancement in the return loss.

(Ultrahigh-Band Mode)

For example, in the ultrahigh-band (reverse) mode, as illustrated in the third row from top in FIG. 4, the switch F1 is turned OFF and the switch F2 is turned ON. As a result, in the ultrahigh-band (reverse) mode, the port P5 of the coupler 150 does not get connected to the port P3, and the port P6 of the coupler 150 gets connected to the port P3. Moreover, in the ultrahigh-band (reverse) mode, the switches F3a and F3b are turned OFF and the switches F4a and F4b are turned ON. As a result, in the ultrahigh-band (reverse) mode, the ports P6 and P3 get connected via the coupling planarization unit 322 and adjustment can be performed in such a way that the frequency dependence of the coupling factor is planarized in the frequency band in the ultrahigh-band mode. Furthermore, in the ultrahigh-band (reverse) mode, the switches F6 and F7 are turned OFF, and the switch F5 is turned ON. As a result, in the ultrahigh-band (reverse) mode, the port P5 gets connected to the ground via the terminal part 304. Thus, by ensuring that the return signals of the signals input to the terminal part 304 via the input port P1 have the opposite phase to the phase of the reverse signals (ISO signals) output to the port P6, the terminal part 304 enables cancelation of the ISO signals by the return signals. Hence, in the ultrahigh-band (reverse) mode, the terminal part 304 enables achieving further enhancement in the isolation, and in turn enables achieving further enhancement in the directivity. At that time, the switches F8 to F10 are turned OFF. Moreover, in the ultrahigh-band (reverse) mode, the switch F12 is turned ON, and the switches F11 and F13 are turned OFF. As a result, in the ultrahigh-band (reverse) mode, the port P3 gets connected to the ground via the matching regulator unit 342 and the impedance of the port P3 is regulated to 50 ohm, thereby enabling achieving further enhancement in the return loss.

(Termination Mode)

For example, in the termination mode, as illustrated in the bottommost row in FIG. 4, the switches F1 to F12 are turned OFF and the switch F13 is turned ON. As a result, in the termination mode, the port P3 gets connected to the ground via the ground connecting unit 344, and the coupler module 140 can be kept in a stable state.

Till now, the explanation was given about the operations in each mode in the reverse state. Similarly, in each mode in the forward state too, the operations are performed in an identical manner except for the fact that the switch F1 is turned ON and the switch F2 is turned OFF. Hence, the same explanation is not given again. Meanwhile, according to the embodiment, the control for switching the switches F1, F2, F3a, F3b, F4a, F4b, and F5 to F13 can be performed by the control circuit 120.

<1.6 Simulation result for coupler module 140 according to embodiment of application concerned>

Till now, the explanation was given about an example of operations of the coupler module 140 according to the embodiment. Explained below with reference to FIGS. 5A, 5B, 5C, 6A, 6B, 6C, 7A, 7B, 7C, 8A, 8B, 8C, 9A, and 9B are the simulation results for the coupler module 140 according to the embodiment. The simulation results given below were obtained using existing simulation software capable of simulating the state of high-frequency signals based on the model parameters and the circuit diagram of each circuit element.

FIGS. 5A, 6A, 7A, and 8A are explanatory diagrams for explaining an example of operations in the low-band mode, the high-band mode, the ultrahigh-band mode, and the termination mode (forward), respectively, of the coupler module 140 according to the embodiment. In FIGS. 5B, 6B, 7B, and 8B are illustrated simulation results regarding the coupling factor and the isolation in the low-band mode, the high-band mode, the ultrahigh-band mode, and the termination mode (forward), respectively, of the coupler module 140 according to the embodiment. Meanwhile, in the above-mentioned diagrams, the result illustrated using a dashed-dotted line indicates the frequency dependence of the coupling factor, and the result illustrated using a dashed line indicates the isolation. In FIGS. 5C, 6C, 7C, and 8C are illustrated simulation results regarding the return loss in the low-band mode, the high-band mode, the ultrahigh-band mode, and the termination mode, respectively, of the coupler module 140 according to the embodiment. In FIG. 9A is illustrated the simulation result regarding the coupling factor and the isolation in the ultrahigh-band mode of the coupler module 140 according to the embodiment and the coupler module 140a according to the comparison example. In FIG. 9B is illustrated the simulation result regarding the return loss in the ultrahigh-band mode of the coupler module 140 according to the embodiment and the coupler module 140a according to the comparison example. In FIGS. 9A and 9B, the result illustrated using a dashed-dotted line indicates the result regarding the coupler module 140 according to the embodiment, and the result illustrated using a dashed line indicates the result regarding the coupler module 140a according to the comparison example.

(Low-Band Mode)

Figure 5A:
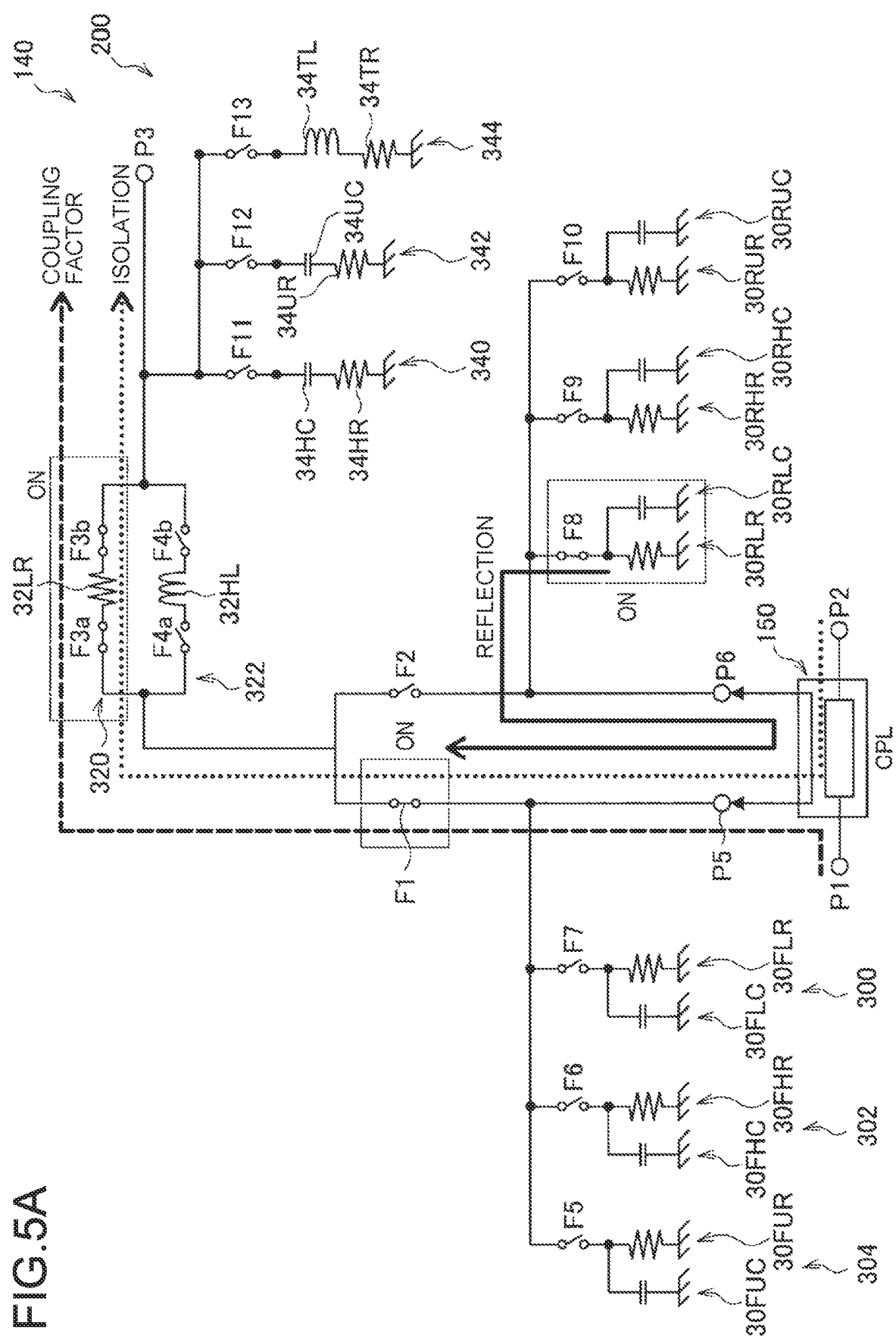
FIG. 5A is an explanatory diagram for explaining an example of operations in a low-band mode of the coupler module 140 according to the embodiment.

For example, in the low-band mode (forward), as illustrated in FIG. 5A, the switches F1, F3a, F3b, and F8 were turned ON and the remaining switches were turned OFF. The simulation result obtained for the low-band mode is illustrated in FIGS. 5B and 5C.

Figure 5B:
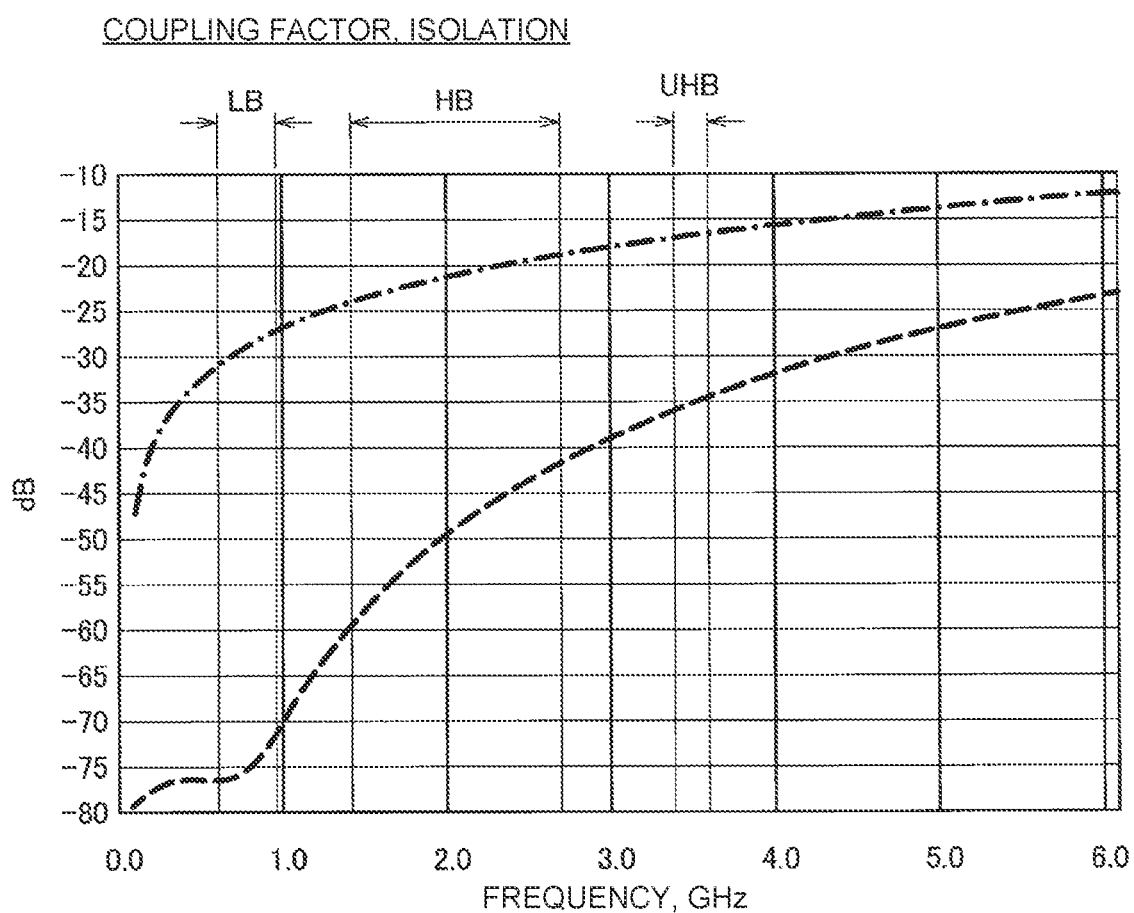
FIG. 5B is a diagram illustrating the simulation result regarding the coupling factor and the isolation in the low-band mode of the coupler module 140 according to the embodiment.
Figure 5C:
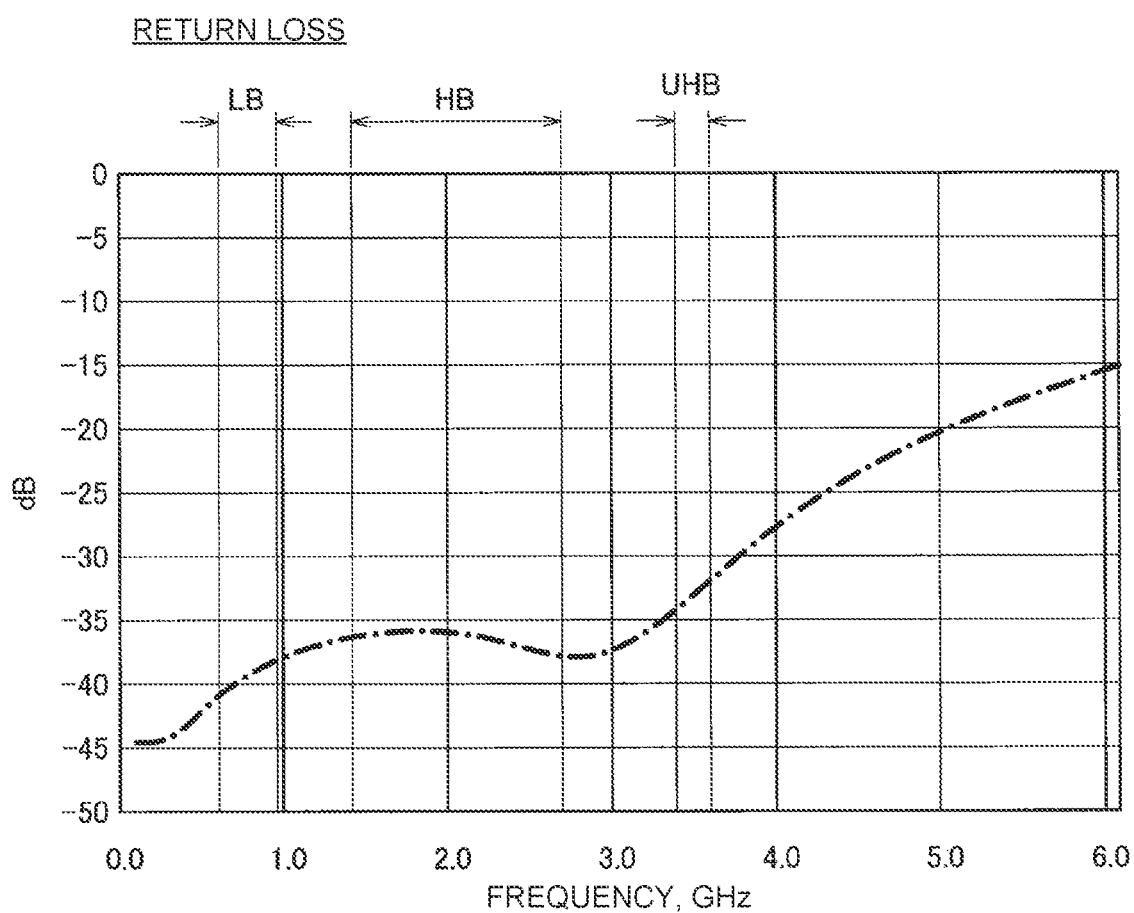
FIG. 5C is a diagram illustrating the simulation result regarding the return loss in the low-band mode of the coupler module 140 according to the embodiment.

As illustrated in FIG. 5B, in the low-band mode (forward), it was possible to have flat frequency dependence of the coupling factor in the low-band frequency band (for example, in the range from 620 MHz to 960 MHz). Moreover, as illustrated in FIG. 5B, the isolation too was low in the low-band frequency band. Furthermore, as illustrated in FIG. 5C, the return loss too was low in the low-band frequency band. That is, according to the embodiment, in the low-band frequency band, it was possible to obtain excellent isolation and excellent return loss.

(High-Band Mode)

Figure 6A:
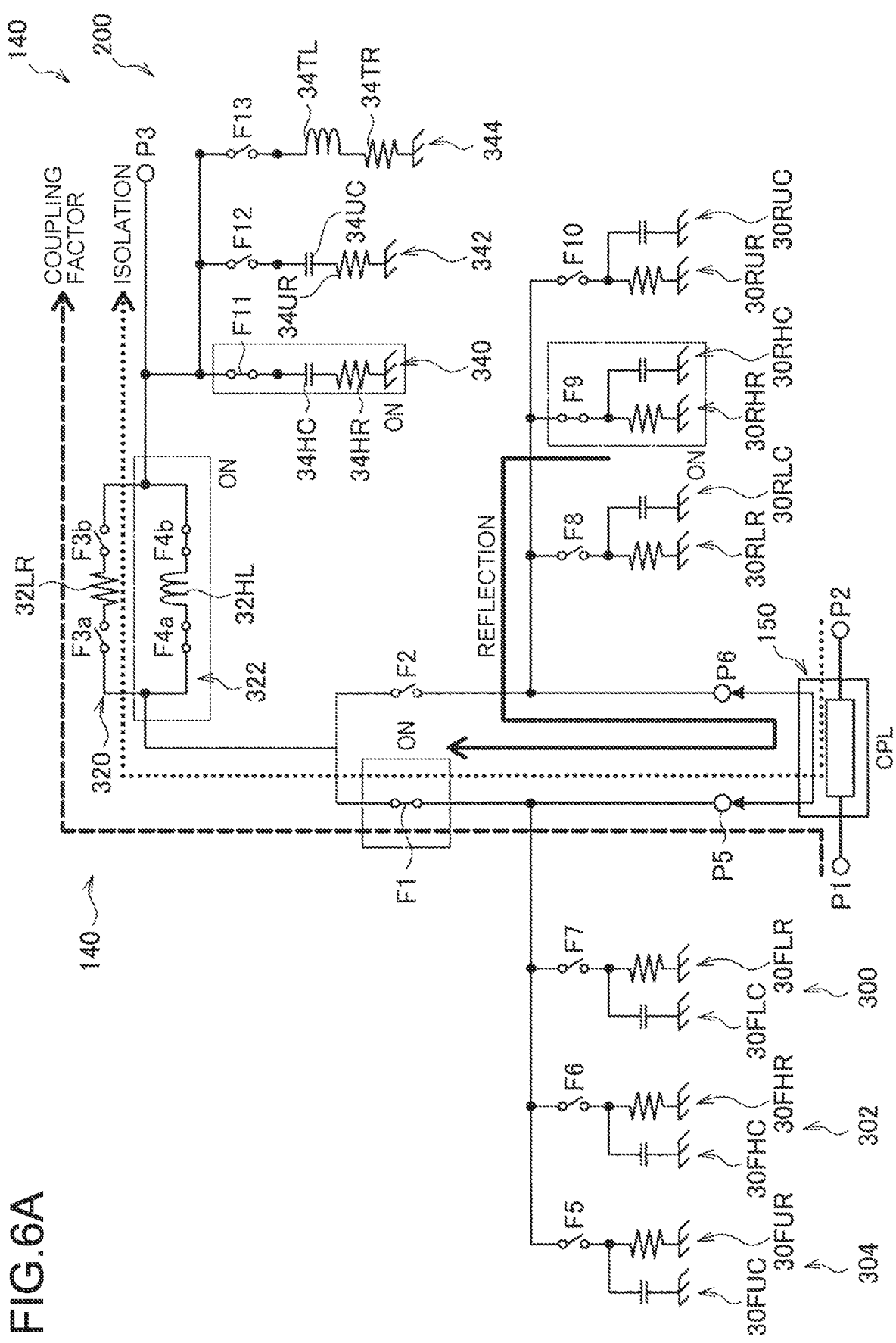
FIG. 6A is an explanatory diagram for explaining an example of operations in a high-band mode of the coupler module 140 according to the embodiment.

For example, in the high-band mode (forward), as illustrated in FIG. 6A, the switches F1, F4a, F4b, F9, and F11 were turned ON and the remaining switches were turned OFF. The simulation result obtained for the high-band mode is illustrated in FIGS. 6B and 6C.

Figure 6B:
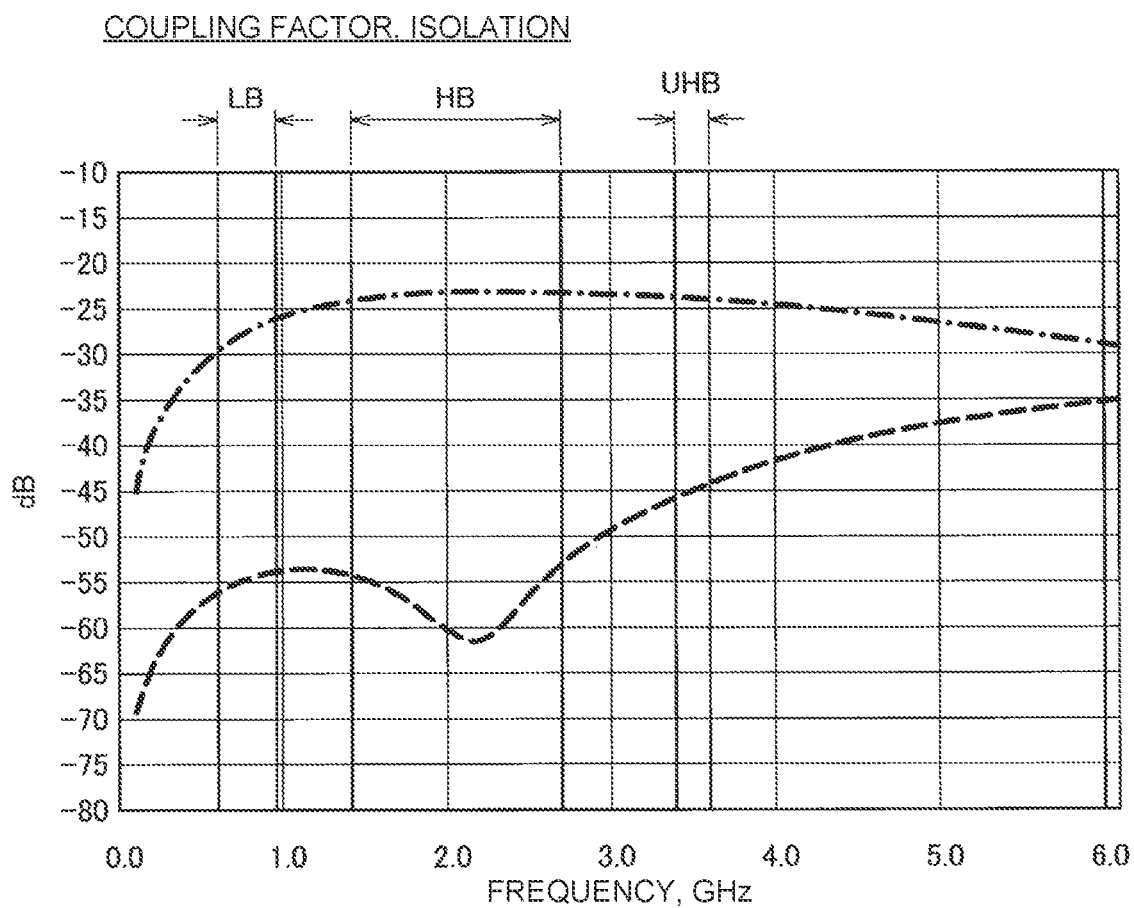
FIG. 6B is a diagram illustrating the simulation result regarding the coupling factor and the isolation in the high-band mode of the coupler module 140 according to the embodiment.
Figure 6C:
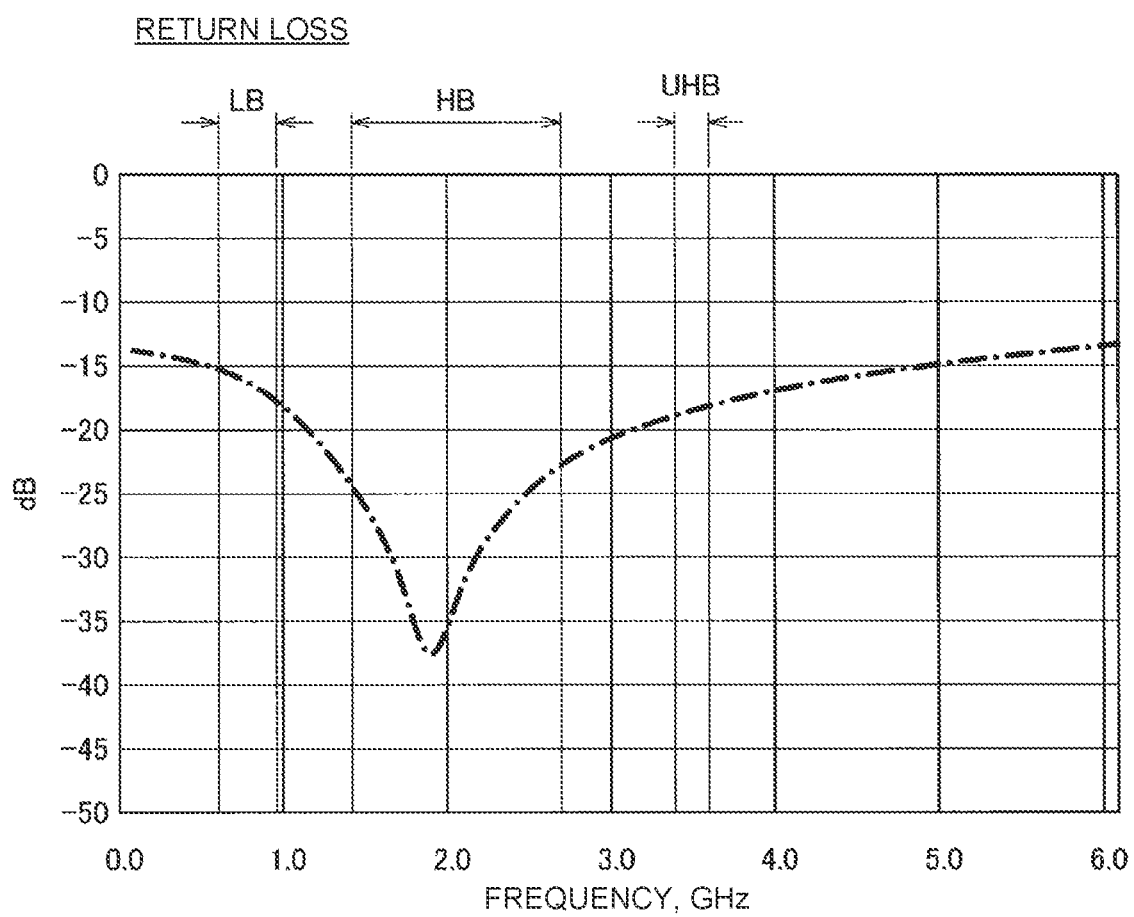
FIG. 6C is a diagram illustrating the simulation result regarding the return loss in the high-band mode of the coupler module 140 according to the embodiment.

As illustrated in FIG. 6B, in the high-band mode, it was possible to have flat frequency dependence of the coupling factor in the high-band frequency band (for example, in the range from 1430 MHz to 2690 MHz) (in the drawings mentioned below, a range indicated as HB). Moreover, as illustrated in FIG. 6B, the isolation too was low in the high-band frequency band. Furthermore, as illustrated in FIG. 6C, the return loss too was low in the high-band frequency band. That is, according to the embodiment, in the high-band frequency band, it was possible to obtain excellent isolation and excellent return loss.

(Ultrahigh-Band Mode)

Figure 7A:
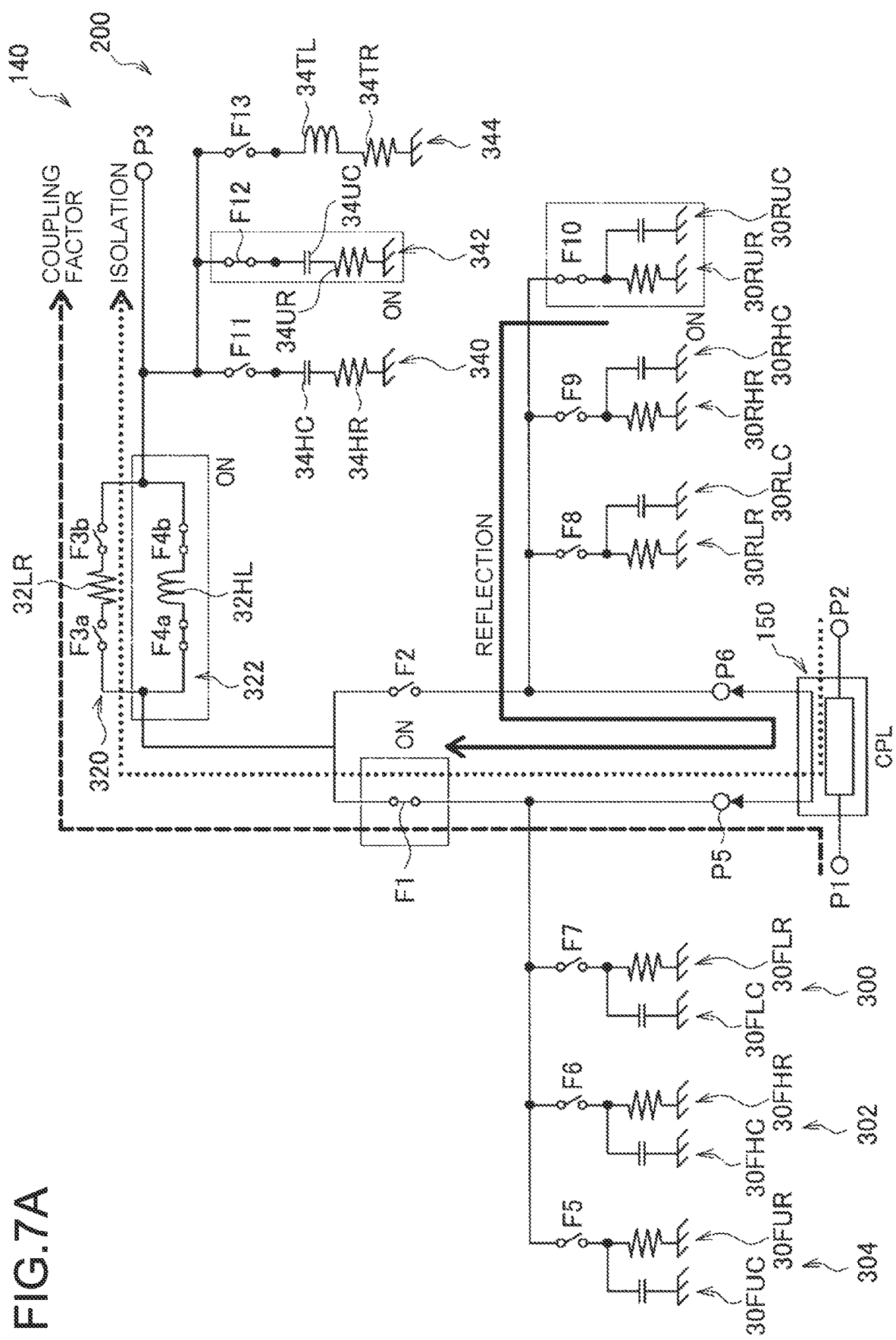
FIG. 7A is an explanatory diagram for explaining an example of operations in an ultrahigh-band mode of the coupler module 140 according to the embodiment.

For example, in the ultrahigh-band mode (forward), as illustrated in FIG. 7A, the switches F1, F4a, F4b, F10, and F12 were turned ON and the remaining switches were turned OFF. The simulation result obtained for the ultrahigh-band is illustrated in FIGS. 7B and 7C.

Figure 7B:
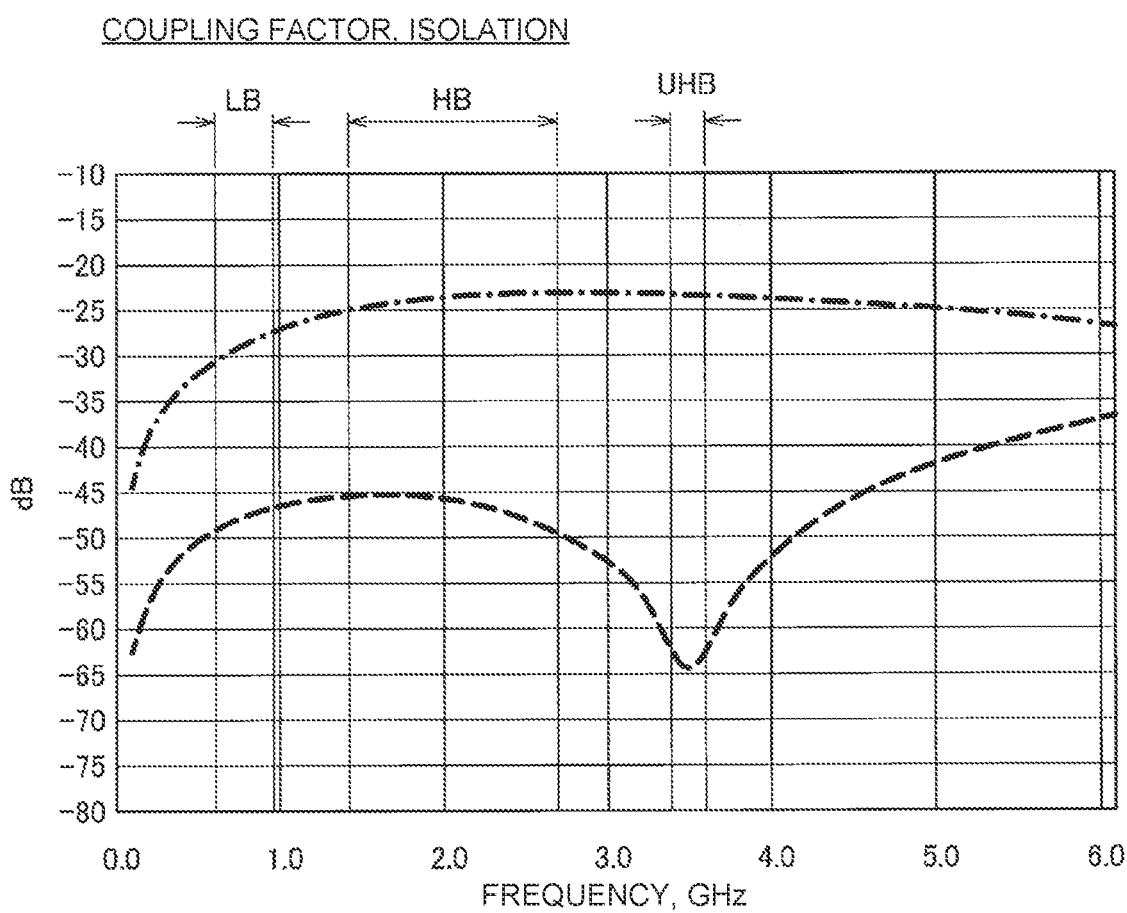
FIG. 7B is a diagram illustrating the simulation result regarding the coupling factor and the isolation in the ultrahigh-band mode of the coupler module 140 according to the embodiment.
Figure 7C:
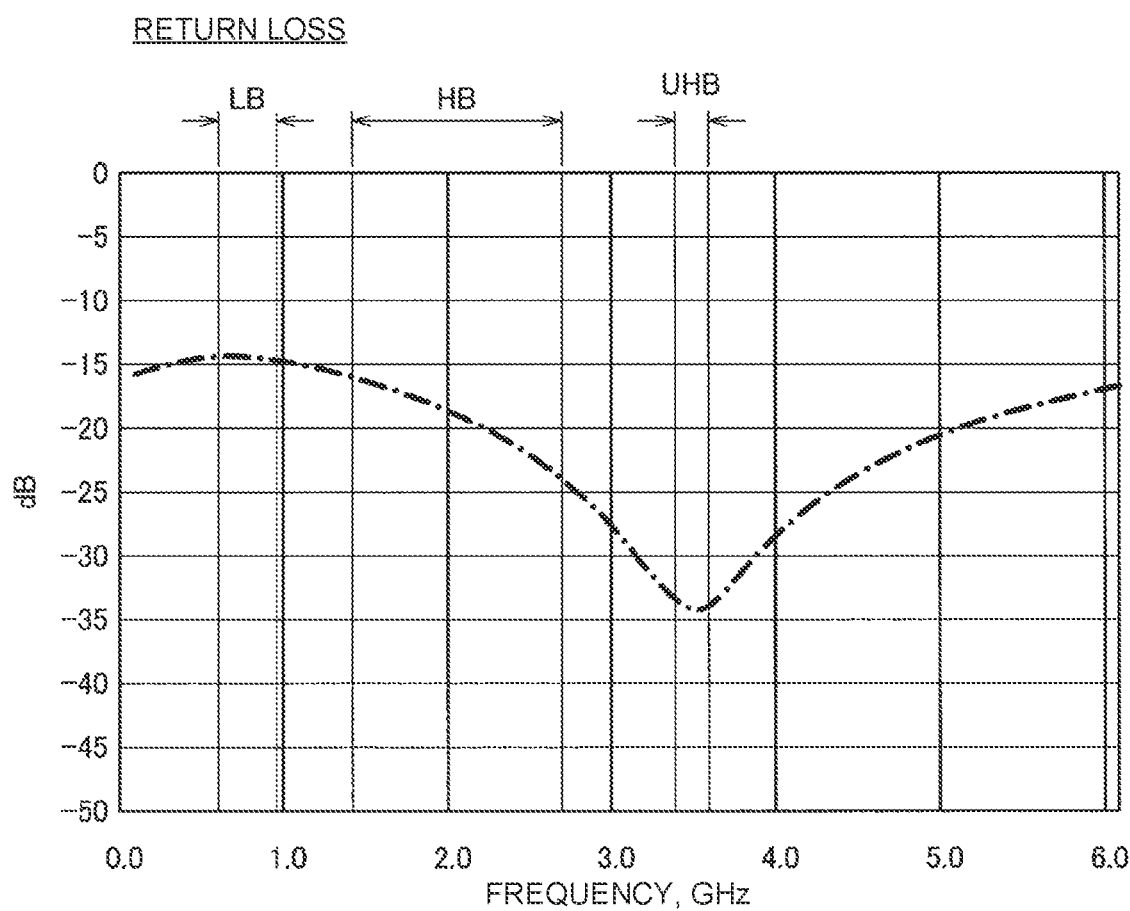
FIG. 7C is a diagram illustrating the simulation result regarding the return loss in the ultrahigh-band mode of the coupler module 140 according to the embodiment.

As illustrated in FIG. 7B, in the ultrahigh-band mode, it was possible to have flat frequency dependence of the coupling factor in the ultrahigh-band frequency band (for example, in the range from 3400 MHz to 3600 MHz) (in the drawings mentioned below, a range indicated as UHB). Moreover, as illustrated in FIG. 7B, the isolation too was low in the ultrahigh-band frequency band. Furthermore, as illustrated in FIG. 7C, the return loss too was low in the ultrahigh-band frequency band. That is, according to the embodiment, in the ultrahigh-band frequency band, it was possible to obtain excellent isolation and excellent return loss.

(Termination Mode)

Figure 8A:
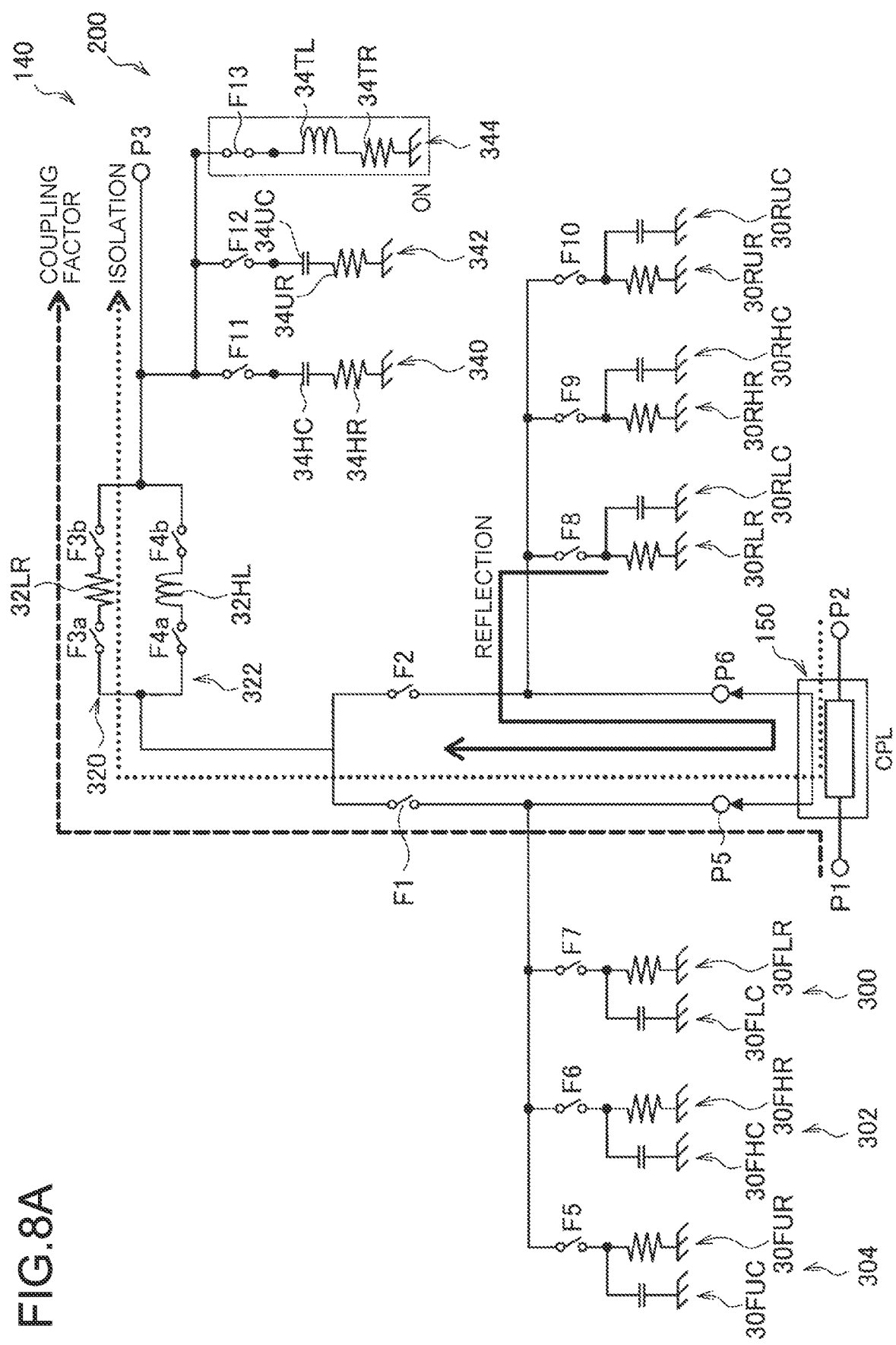
FIG. 8A is an explanatory diagram for explaining an example of operations in a termination mode of the coupler module 140 according to the embodiment.
Figure 8B:
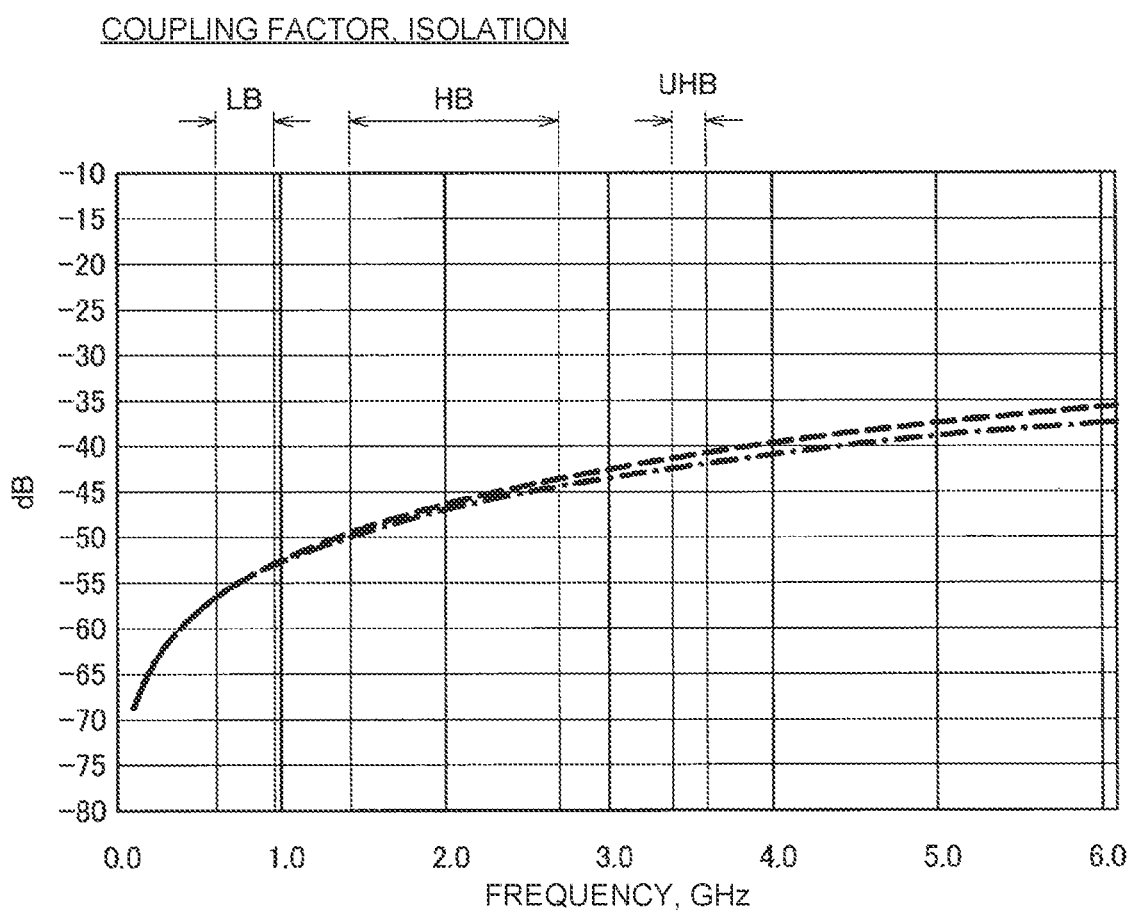
FIG. 8B is a diagram illustrating the simulation result regarding the coupling factor and the isolation in the termination mode of the coupler module 140 according to the embodiment.
Figure 8C:
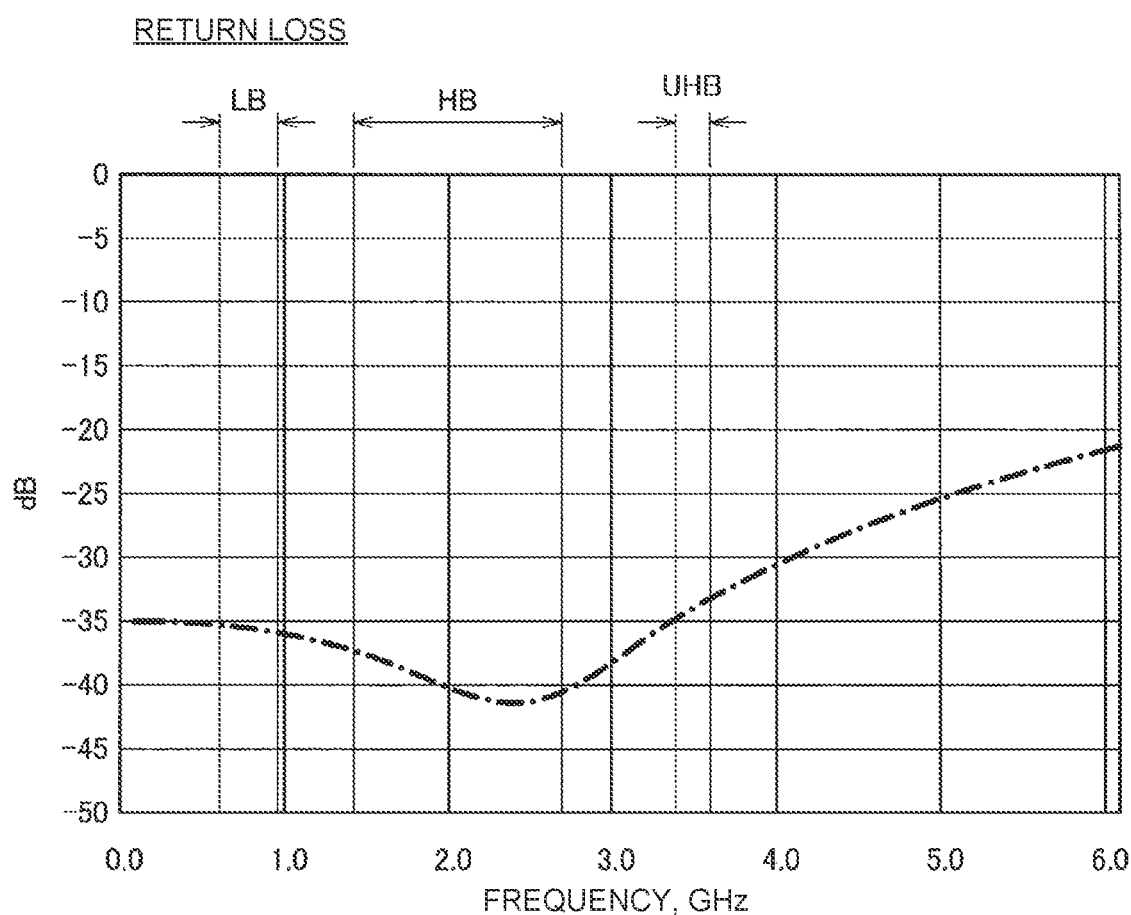
FIG. 8C is a diagram illustrating the simulation result regarding the return loss in the termination mode of the coupler module 140 according to the embodiment.
Figure 9B:
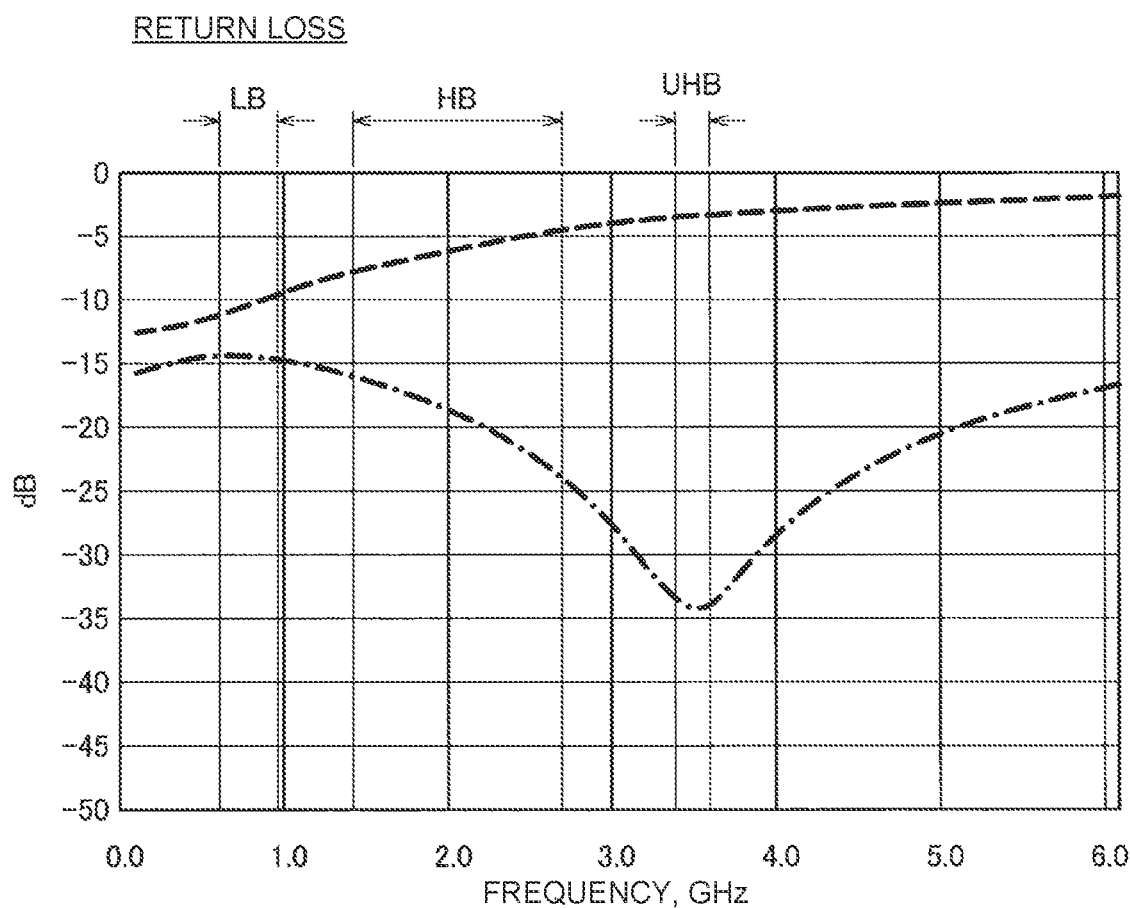
FIG. 9B is a diagram illustrating the simulation result regarding the return loss in the ultrahigh-band mode of the coupler module 140 according to the embodiment and the coupler module 140a according to the comparison example.

For example, in the terminal mode, as illustrated in FIG. 8A, the switch F13 was turned ON and the remaining switches were turned OFF. The simulation result obtained for the termination mode is illustrated in FIGS. 8B and 8C.

If the port P3 is not connected to the ground connecting unit 344 that is capable of regulation to 50 ohm, then it leads to infinite impedance. However, according to the embodiment, as illustrated in FIG. 8C, since the port P3 was connected to the ground connecting unit 344, the impedance was regulated to 50 ohm. As a result, it was possible to obtain excellent return loss in a wide frequency band.

(Comparison with Comparison Example)

Herein, the simulation result for the coupler module 140 according to the embodiment is compared with the simulation result for the coupler module 140a according to the comparison example illustrated in FIG. 19. In FIGS. 9A and 9B is illustrated the simulation result obtained for the ultrahigh-band mode (forward).

In the embodiment as well as the comparison example, there is no conspicuous difference in the coupling factor and the isolation as illustrated in FIG. 9A. However, there is a conspicuous difference in the return loss as illustrated in FIG. 9B. More specifically, at the frequency of 3600 MHz, in the comparison example, the return loss was about −2 dB. On the other hand, according to the embodiment, the return loss equal to or lower than −30 dB was secured. That is, according to the embodiment, the return loss can be further enhanced.

<1.7 Modification examples>

Figure 10A:
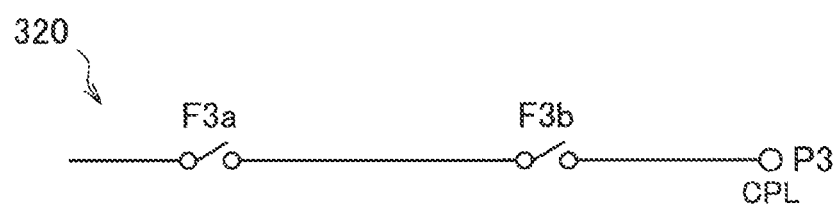
FIG. 10A is an explanatory diagram (1) for explaining a modification example of a coupling planarization unit 320 of the coupler module 140 according to the embodiment.
Figure 10B:
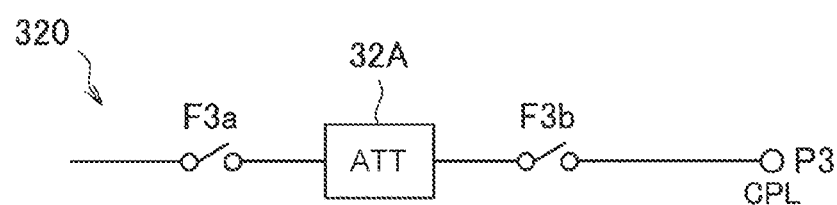
FIG. 10B is an explanatory diagram (2) for explaining a modification example of the coupling planarization unit 320 of the coupler module 140 according to the embodiment.
Figure 11A:
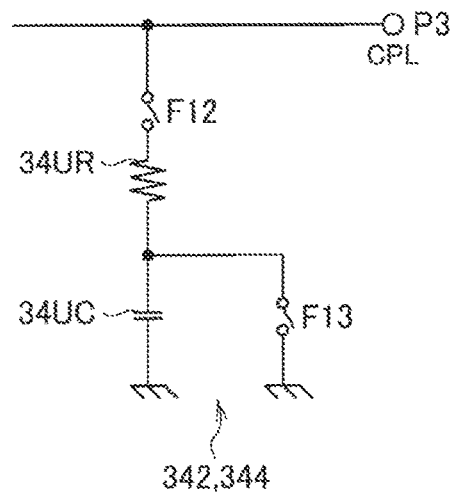
FIG. 11A is an explanatory diagram (1) for explaining a modification example of a ground connecting unit 344 of the coupler module 140 according to the embodiment.
Figure 11B:
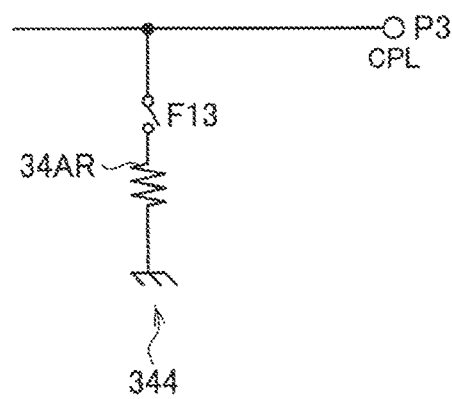
FIG. 11B is an explanatory diagram (2) for explaining a modification example of the ground connecting unit 344 of the coupler module 140 according to the embodiment.
Figure 11C:
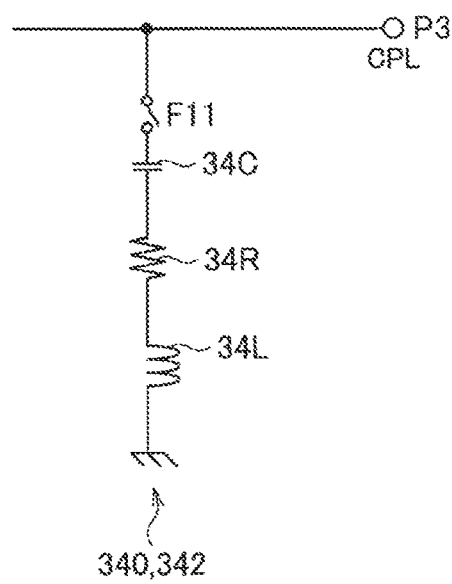
FIG. 11C is an explanatory diagram (1) for explaining modification examples of matching regulator units 340 and 342 of the coupler module 140 according to the embodiment.
Figure 11D:
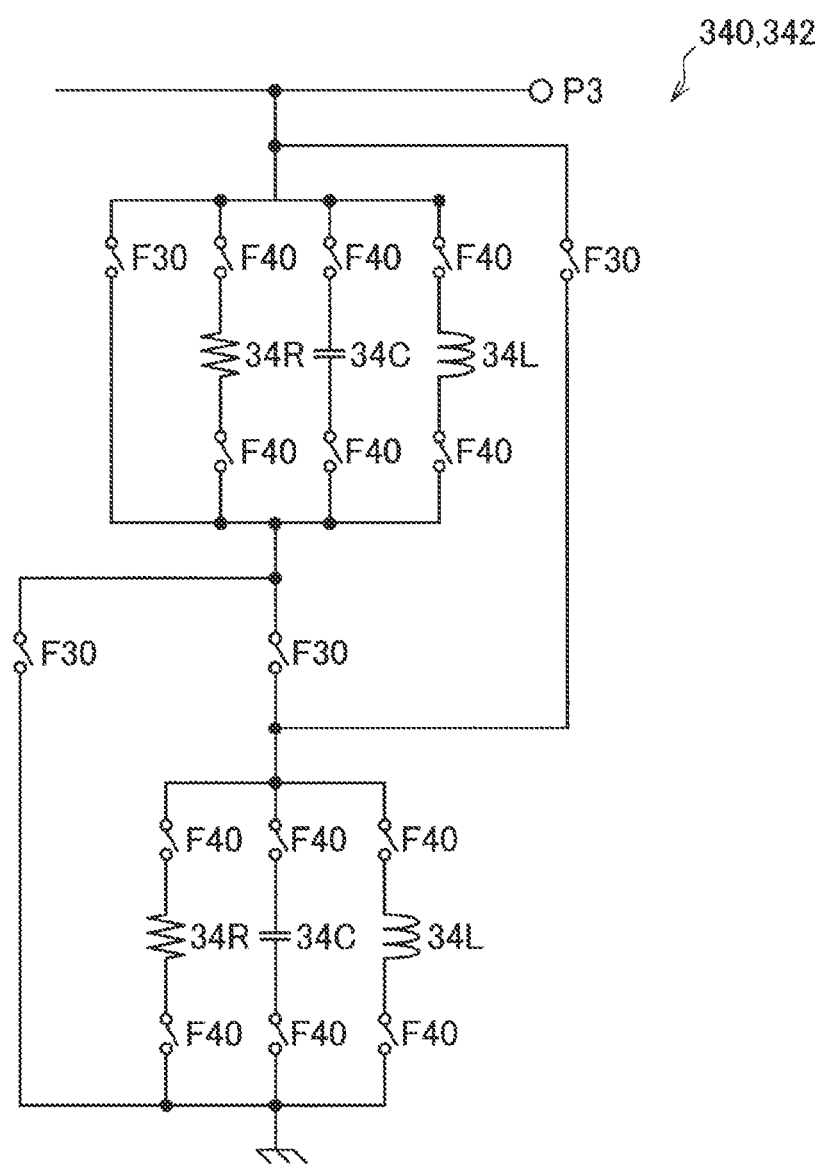
FIG. 11D is an explanatory diagram (2) for explaining modification examples of the matching regulator units 340 and 342 of the coupler module 140 according to the embodiment.

Till now, the explanation was given about the simulation result for the coupler module 140 according to the embodiment. Explained below with reference to FIGS. 10A, 10B, 11A, 11B, 11C, and 11D are modification examples of the embodiment. FIGS. 10A and 10B are explanatory diagrams for explaining modification examples of the coupling planarization unit 320 of the coupler module 140 according to the embodiment. FIGS. 11A and 11B are explanatory diagrams for explaining modification examples of the ground connecting unit 344 of the coupler module 140 according to the embodiment. FIGS. 11C and 11D are explanatory diagrams for explaining modification examples of the matching regulator units 340 and 342 of the coupler module 140 according to the embodiment.

Firstly, the explanation is given about the modification examples of the coupling planarization unit 320. As illustrated in FIG. 10A, the coupling planarization unit 320 can be configured to not include any elements in between the switches F3a and F3b. Alternatively, as illustrated in FIG. 10B, in the coupling planarization unit 320, an attenuator (ATT) 32A can be connected in between the switches F3a and F3b. Herein, although the explanation is given about the coupling planarization unit 320, the coupling planarization unit 322 too can have an identical configuration. That is, according to the embodiment, there is no particular restriction on the configuration of the coupling planarization units 320 and 322.

The following explanation is given about the modification examples of the ground connecting unit 344. For example, when the resistor 34UR and the capacitor 34UC are connected in series as illustrated in FIG. 11A, a switch (a bypass switch) F13 meant for bypassing both ends of the capacitor 34UC can be connected so as to make the matching regulator unit 342 function as the ground connecting unit 344. More specifically, in the case of making the matching regulator unit 342 function as the matching regulator unit 342 itself, the switch F12 is turned ON and the switch F13 is turned OFF so that the port P3 and the ground can be connected via the resistor 34UR and the capacitor 34UC. On the other hand, in the case of making the matching regulator unit 342 as the ground connecting unit 344, the switches F12 and F13 are turned ON so that the port P3 and the ground can be connected via the resistor 34UR. According to this modification example, some elements can be used in common between the matching regulator unit 342 and the ground connecting unit 344, thereby enabling achieving reduction in the surface integral of the substrate (chip) on which the regulator circuit 200 is mounted.

As illustrated in FIG. 11B, the ground connecting unit 344 can be configured only with a resistor 34AR. Thus, according to the embodiment, there is no particular restriction on the configuration of the ground connecting unit 344.

The following explanation is given about the modification examples of the matching regulator units 340 and 342. For example, as illustrated in FIG. 11C, each of the matching regulator units 340 and 342 can include a resistor 34R, a capacitor 34C, and an inductor 34L connected in series.

Alternatively, as illustrated in FIG. 11D, each of the matching regulator units 340 and 342 can be configured with the following: sets of the resistors 34R, the capacitors 34C, and the inductors 34L connected in parallel; switches F40 connected to those elements; and switches F30 that connects both ends of the sets of the resistors 34R, the capacitors 34C, and the inductors 34L connected in parallel. In such a case, by switching between the switches F30 and F40, the matching regulator units 340 and 342 can be configured to correspond to each mode. Thus, according to the embodiment, there is no particular restriction on the configuration of the matching regulator units 340 and 342.

<1.8. Summary>

According to the embodiment of the application concerned, it becomes possible to provide the coupler module 140 that enables achieving further enhancement in the return loss.

<<2. Application Examples of Embodiment of Application Concerned>>

The coupler module 140 according to the embodiment can be mounted in various radio communication terminals, components, and relay devices; such as in a smartphone, a tablet, a wearable terminal, a note PC (Personal Computer), a mobile router, an in-vehicle radio module (for example, a car navigation system), a commercial radio module (for railway, aviation, fir fighting, disaster, and healthcare), a robot, a drone, a weather radar system, an in-vehicle radar system, satellite communication, or an IC (Integrated Circuit)-TAG. That is, the technology according to the application concerned can be applied in various types of radio communication terminals. Given below is the explanation of various application examples of the embodiment.

<2.1 Radio Communication>

The technology according to the application concerned can be applied in a radio communication unit such as a control entity, a base station, or a terminal device. For example, a control entity can be implemented as a server of any one of a tower server, a rack server, or a blade server. Moreover, a control entity can be a control module mounted in a server (for example, can be an integrated circuit module configured in one dye, or can be a card or a blade inserted in a slot of a blade server).

For example, a base station can be implemented as an eNB (evolved Node B) of either the macro eNB type or the small eNB type. A small eNB, such as a pico eNB, or a micro eNB, or a home (femto) eNB, can be an eNB covering smaller cells than macro cells. Alternatively, the base station can be implemented as a base station of some other type such as NodeB or BTS (Base Transceiver Station). The base station can include the main body (base station device) that controls the radio communication, and include one or more RRHs (Remote Radio Heads) placed at different locations than the main body. Still alternatively, various types of terminals (described later) can be configured to execute, temporarily or permanently, the base station function, and operate as the base stations.

Meanwhile, for example, a terminal device can be implemented as a smartphone, a tablet PC (Personal Computer), a notebook PC, a portable game terminal, a mobile terminal such as a portable-type/dongle-type mobile router or a digital camera, or an in-vehicle terminal such as a car navigation device. Alternatively, the terminal devices can be implemented as terminals performing M2M (Machine To Machine) communication (also called MTC (Machine Type Communication) terminals). Still alternatively, the terminal devices can be radio communication modules (for example, integrated circuit modules configured using a single die) installed on terminals.

[2.1.1. Application Example Regarding Control Entity]

Figure 12:
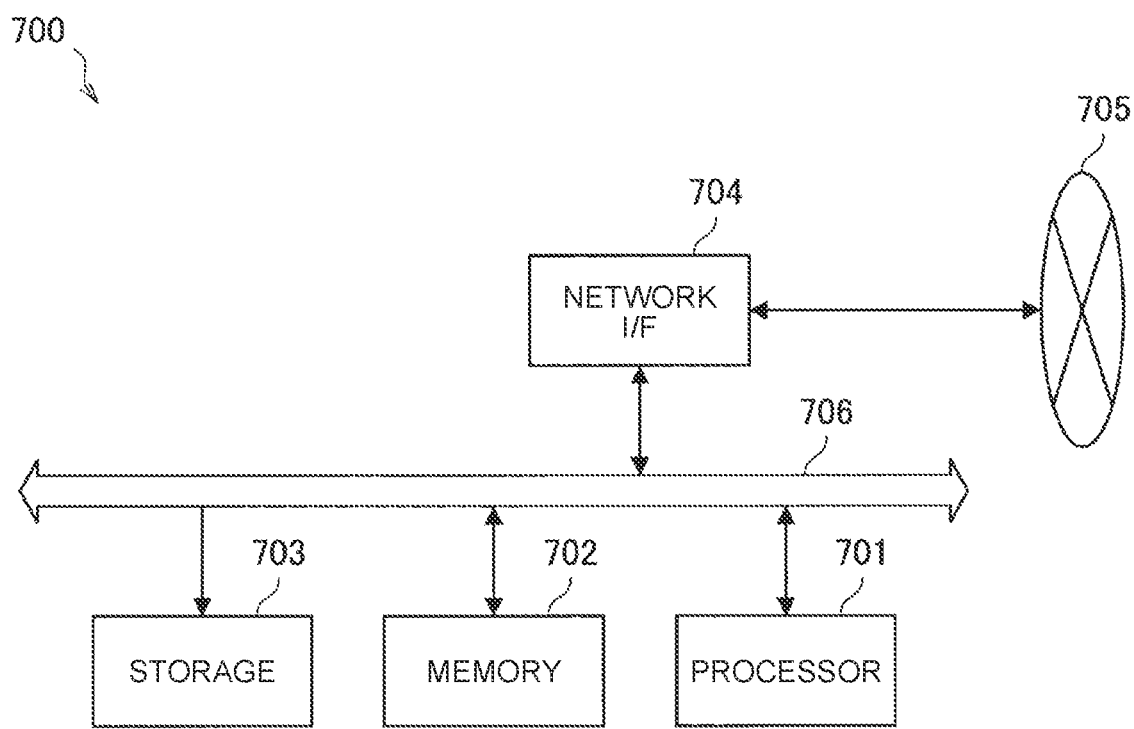
FIG. 12 is a block diagram illustrating an exemplary schematic configuration of a server 700.

FIG. 12 is a block diagram illustrating an exemplary schematic configuration of a server 700 in which the technology disclosed in the application concerned is applicable. The server 700 includes a processor 701, a memory 702, a storage 703, a network interface 704, and a bus 706.

The processor 701 can be, for example, a CPU (Central Processing Unit) or a DSP (Digital Signal Processor), and controls various functions of the server 700. The memory 702 includes a RAM (Random Access Memory) or a ROM (Read Only Memory), and is used to store programs executed by the processor 701 and to store data. The storage 703 can include a memory medium such as a semiconductor memory or a hard disk.

The network interface 704 is a wired communication interface meant for connecting the server 700 to a radio communication network 705. The radio communication network 705 can be a core network such as the EPC (Evolved Packet Core), or can be a PDN (Packet Data Network) such as the Internet.

The bus 706 connects the processor 701, the memory 702, the storage 703, and the network interface 704 to each other. The bus 706 can include two or more buses having different speeds (for example, a high-speed bus and a low-speed bus).

[2.1.2. Application Examples Regarding Base Station]

First Application Example

Figure 13:
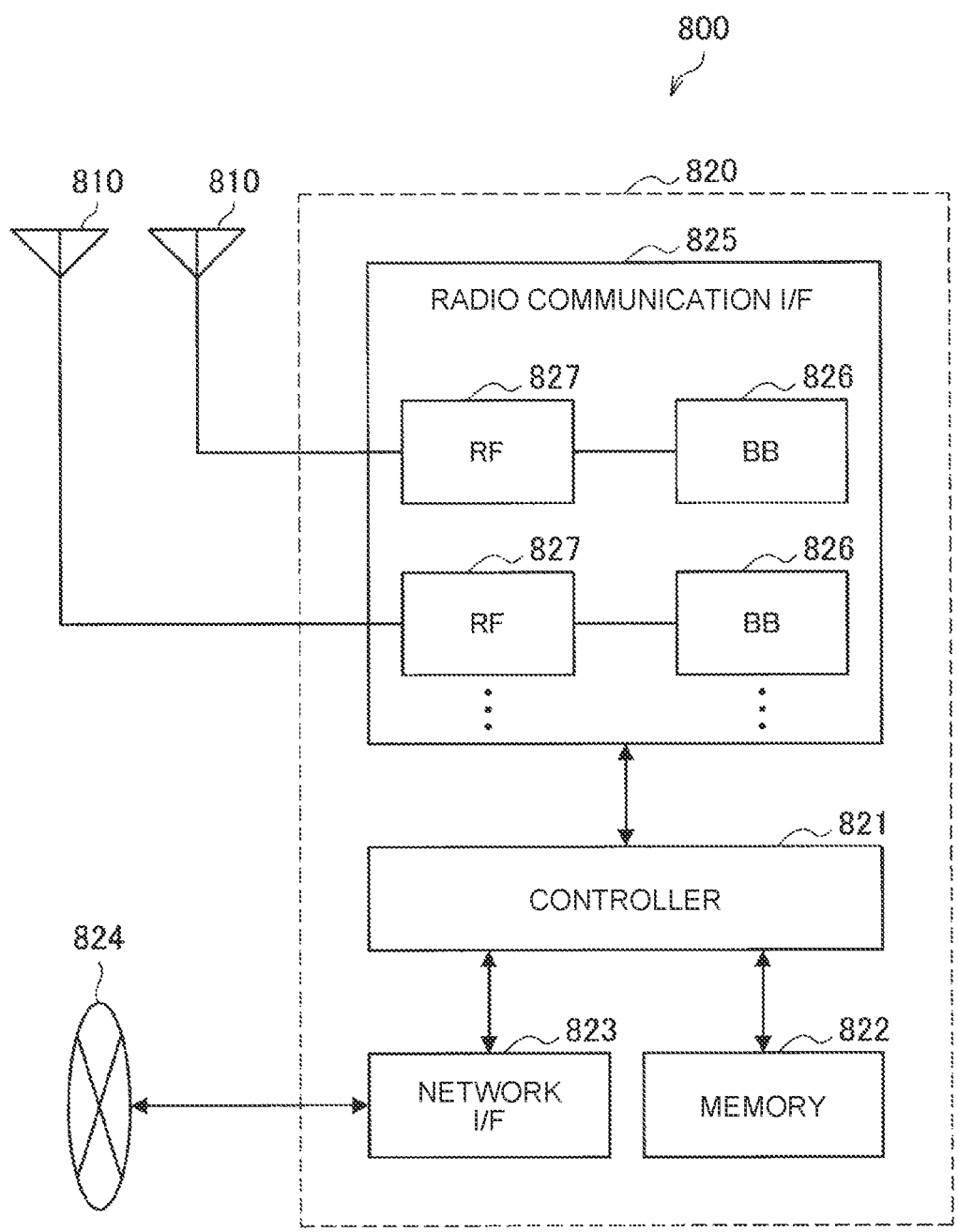
FIG. 13 is a block diagram illustrating a first example of a schematic configuration of an eNB 800.

FIG. 13 is a block diagram illustrating a first example of a schematic configuration of an eNB 800 in which the technology disclosed in the application concerned is applicable. The eNB 800 includes one or more antennas 810 and a base station device 820. The antennas 810 can be connected to the base station device 820 by RF cables.

Each antenna 810 includes one or more antenna elements (for example, a plurality of antenna elements constituting a MIMO (Multiple Input and Multiple Output) antenna), and is used by the base station device 820 in transmitting and receiving radio signals. The eNB 800 includes a plurality of antennas 810 as illustrated in FIG. 13, and each antenna 810 corresponds to, for example, one of a plurality of frequency bands used by the eNB 800. Meanwhile, in the example illustrated in FIG. 13, although the eNB 800 includes a plurality of antennas 810, it can alternatively include only a single antenna 810.

The base station device 820 includes a controller 821, a memory 822, a network interface 823, and a radio communication interface 825.

The controller 821 can be, for example, a CPU or a DSP, and implements various functions of the upper layer of the base station device 820. For example, the controller 821 generates data packets from the data present in the signals processed by the radio communication interface 825, and transfers the generated data packets via the network interface 823. Moreover, the controller 821 can generate bundled packets by bundling the data received from a plurality of baseband processors, and transfer the bundled packets. Furthermore, the controller 821 can have logical functions for performing control such as radio resource control, radio bearer control, mobility management, admission control, and scheduling. That control can be performed in coordination with the surrounding eNBs or core network nodes. The memory 822 includes a RAM and a ROM, and is used to store programs executed by the controller 821 and to store a variety of control data (such as a terminal list, transmission power data, and scheduling data).

The network interface 823 is a communication interface for connecting the base station device 820 to a core network 824. The controller 821 can communicate with core network nodes and the other eNBs via the network interface 823. In that case, the eNB 800 can be connected to the core network nodes and the other eNBs by a logical interface (such as an S1 interface or an X2 interface). The network interface 823 can be a wired communication interface, or can be a radio communication interface for radio backhauling. When the network interface 823 is a radio communication interface, it can perform radio communication using higher frequency bands than the frequency bands used by the radio communication interface 825.

The radio communication interface 825 supports any one cellular communication method such as the LTE (Long Term Evolution) or the LTE-Advanced, and provides radio connection via the antennas 810 to the terminals located inside the cell of the eNB 800. Typically, the radio communication interface 825 can include a baseband (BB) processor 826 and an RF circuit 827. The BB processor 826 can perform, for example, encoding/decoding, modulation/demodulation, and multiplexing/inverse multiplexing; and performs a variety of signal processing for each layer (for example, L1, MAC (Medium Access Control), RLC (Radio Link Control), and PDCP (Packet Data Convergence Protocol)). The BB processor 826 can include, in place of the controller 821, some or all of the logical functions mentioned earlier. The BB processor 826 can be a module including a memory for storing a communication control program, a processor for executing that program, and related circuits; and the functions of the BB processor 826 can be changed by updating the communication control program. Alternatively, the module can be a card or a blade that is inserted in a slot of the base station device 820, or can be a chip installed on the card or the blade. The RF circuit 827 can include a mixer, a filter, and an amplifier; and transmits and receives radio signals via the antennas 810.

The radio communication interface 825 includes a plurality of BB processors 826 as illustrated in FIG. 13, and each BB processor 826 can correspond to, for example, one of a plurality of frequency bands used by the eNB 800. Moreover, the radio communication interface 825 includes a plurality of RF circuits 827 as illustrated in FIG. 13, and each RF circuit 827 can correspond to, for example, one of a plurality of antenna elements. In FIG. 13 is illustrated the example in which the radio communication interface 825 includes a plurality of BB processors 826 and a plurality of RF circuits 827. However, alternatively, the radio communication interface 825 can include only a single BB processor 826 or only a single RF circuit 827.

Second Application Example

Figure 14:
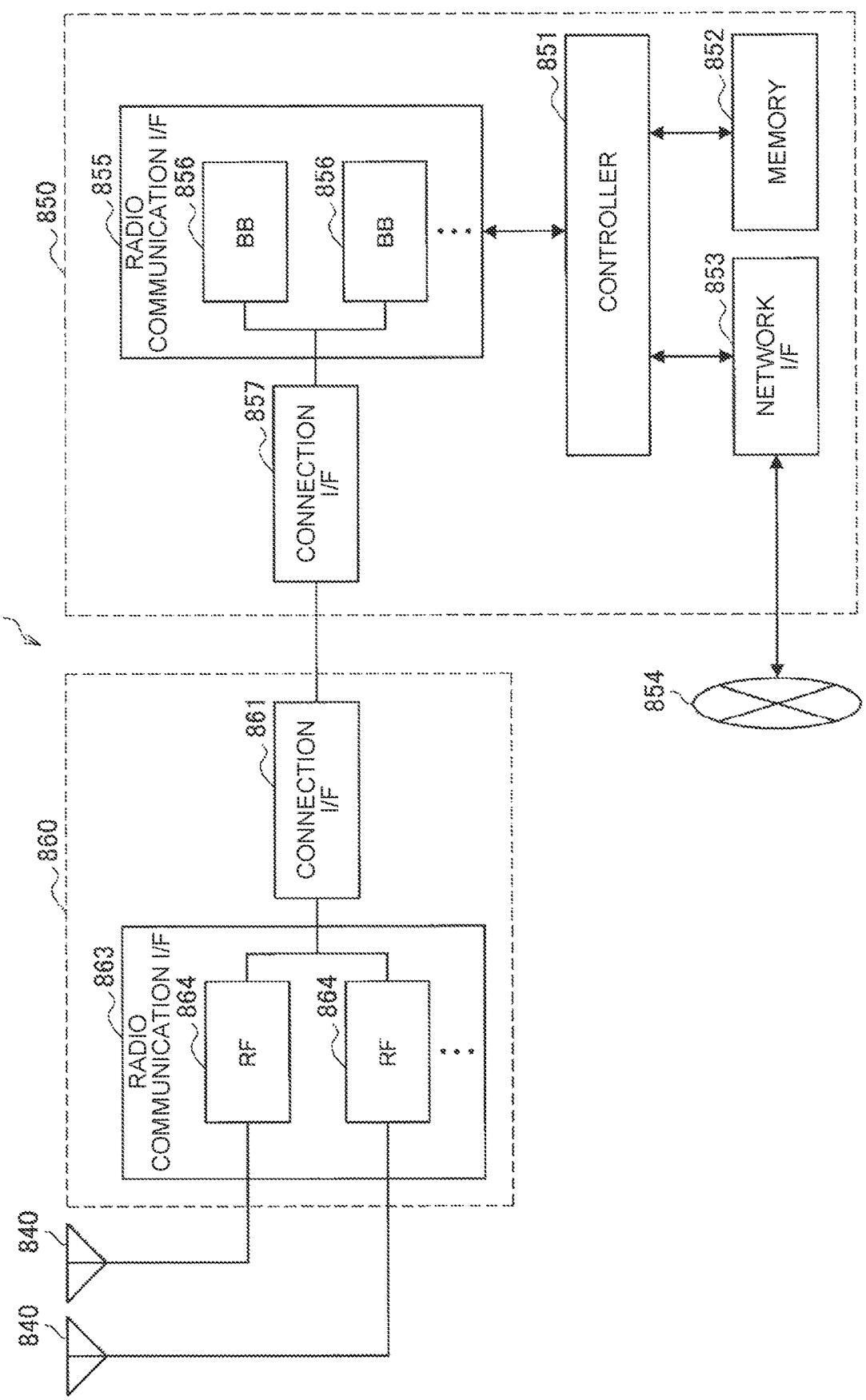
FIG. 14 is a block diagram illustrating a second example of a schematic configuration of an eNB 830.

FIG. 14 is a block diagram illustrating a second example of a schematic configuration of an eNB 830 in which the technology disclosed in the application concerned is applicable. The eNB 830 includes one or more antennas 840, a base station device 850, and an RRH 860. Each antenna 840 is connected to the RRH 860 by an RF cable. Moreover, the base station device 850 and the RRH 860 can be connected to each other by a high-speed line such as an optical fiber cable.

Each antenna 840 includes one or more antenna elements (for example, a plurality of antenna elements constituting a MIMO antenna), and is used by the RRH 860 in transmitting and receiving radio signals. The eNB 830 includes a plurality of antennas 840 as illustrated in FIG. 14, and each antenna 840 corresponds to, for example, one of a plurality of frequency bands used by the eNB 830. Meanwhile, in the example illustrated in FIG. 14, although the eNB 830 includes a plurality of antennas 840, it can alternatively include only a single antenna 840.

The base station device 850 includes a controller 851, a memory 852, a network interface 853, a radio communication interface 855, and a connection interface 857. The controller 851, the memory 852, and the network interface 853 are identical to the controller 821, the memory 822, and the network interface 823, respectively, explained with reference to FIG. 13.

The radio communication interface 855 supports any one cellular communication method such as the LTE or the LTE-Advanced, and provides radio connection via the RRH 860 and the antennas 840 to the terminals located inside the sector corresponding to the RRH 860. Typically, the radio communication interface 855 can include a BB processor 856. The BB processor 856 is identical to the BB processor 826 explained with reference to FIG. 13, except for the fact that the BB processor 856 is connected to an RF circuit 864 of the RRH 860 via the connection interface 857. The radio communication interface 855 includes a plurality of BB processors 856 as illustrated in FIG. 14, and each BB processor 856 can correspond to, for example, one of a plurality of frequency bands used by the eNB 830. Meanwhile, in the example illustrated in FIG. 14, although the radio communication interface 855 includes a plurality of BB processors 856, it can alternatively include only a single BB processor 856.

The connection interface 857 is meant for connecting the base station device 850 (the radio communication interface 855) to the RRH 860. The connection interface 857 can be a communication module for enabling communication in the abovementioned high-speed line connecting the base station device 850 (the radio communication interface 855) and the RRH 860.

The RRH 860 includes a connection interface 861 and a radio communication interface 863.

The connection interface 861 is an interface for connecting the RRH 860 (the radio communication interface 863) to the base station device 850. The connection interface 861 can be a communication module enabling communication in the high-speed line.

The radio communication interface 863 transmits and receives radio signals via the antenna 840. Typically, the radio communication interface 863 can include the RF circuit 864. The RF circuit 864 can include a mixer, a filter, and an amplifier; and transmits and receives radio signals via the antennas 840. The radio communication interface 863 includes a plurality of RF circuits 864 as illustrated in FIG. 14, and each RF circuit 864 can correspond to, for example, one of a plurality of antenna elements. Meanwhile, in the example illustrated in FIG. 14, although the radio communication interface 863 includes a plurality of RF circuits 864, it can alternatively include only a single RF circuit 864.

[2.1.3. Application Examples Regarding Handheld Terminal]

First Application Example

Figure 15:
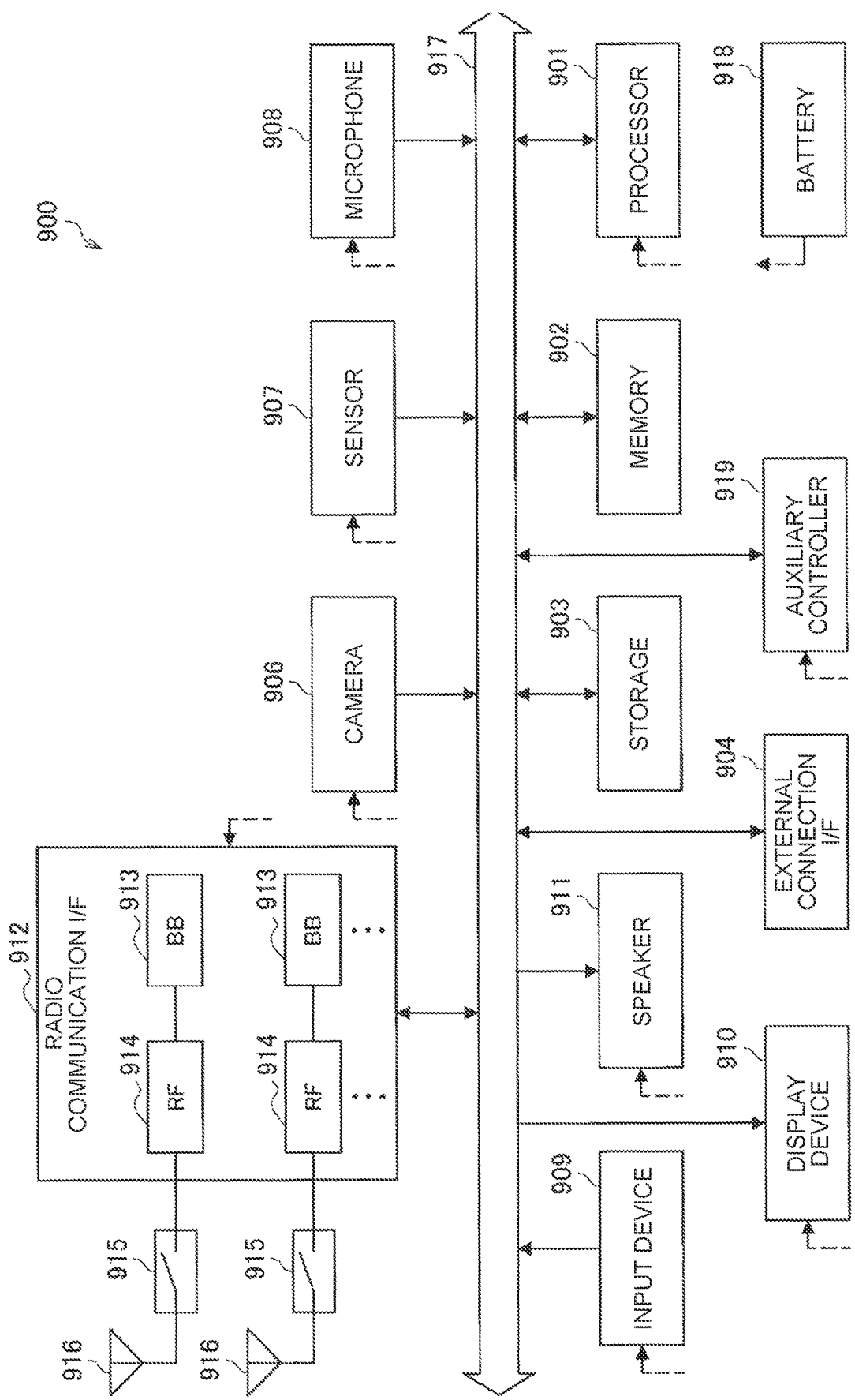
FIG. 15 is a block diagram illustrating an exemplary schematic configuration of a smartphone 900.

FIG. 15 is a block diagram illustrating an exemplary schematic configuration of a smartphone 900 in which the technology disclosed in the application concerned is applicable. The smartphone 900 includes a processor 901, a memory 902, a storage 903, an external connection interface 904, a camera 906, a sensor 907, a microphone 908, an input device 909, a display device 910, a speaker 911, a radio communication interface 912, one or more antenna switches 915, one or more antennas 916, a bus 917, a battery 918, and an auxiliary controller 919.

The processor 901 can be, for example, a CPU or an SoC (System on Chip), and controls the functions of the application layer and the other layers of the smartphone 900. The memory 902 includes a RAM and a ROM, and is used to store the programs executed by the processor 901 and to store data. The storage 903 can include a memory medium such as a semiconductor memory or a hard disk. The external connection interface 904 is an interface for connecting an external device, such as a memory card or a USB (Universal Serial Bus) device, to the smartphone 900.

The camera 906 includes an imaging device such as a CCD (Charge Coupled Device) or a CMOS (Complementary Metal Oxide Semiconductor), and generates captured images. The sensor 907 can include a group of sensors such as a positioning sensor, a gyro sensor, a geomagnetic sensor, and an acceleration sensor. The microphone 908 converts the sounds input to the smartphone 900 into sound signals. The input device 909 includes, for example, a touch sensor for detecting a touch on the screen of the display device 910, a keypad, a keyboard, and buttons or switches; and receives operations and information input from the user. The display device 910 has a screen such as a liquid crystal display (LCD) or an organic light emitting diode (OLED) display, and displays output images of the smartphone 900. The speaker 911 converts the sound signals, which are output from the smartphone 900, into sound.

The radio communication interface 912 supports any one cellular communication method such as the LTE or the LTE-Advanced, and implements radio communication. Typically, the radio communication interface 912 can include a BB processor 913 and an RF circuit 914. The BB processor 913 can perform, for example, encoding/decoding, modulation/demodulation, and multiplexing/inverse multiplexing; and performs a variety of signal processing for radio communication. The RF circuit 914 can include a mixer, a filter, and an amplifier; and transmits and receives radio signals via the antennas 916. Meanwhile, the radio communication interface 912 can be a one-chip module in which the BB processor 913 and the RF circuit 914 are integrated. Moreover, the radio communication interface 912 can include a plurality of BB processors 913 and a plurality of RF circuits 914 as illustrated in FIG. 15. Meanwhile, in the example illustrated in FIG. 15, although the radio communication interface 912 includes a plurality of BB processors 913 and a plurality of RF circuits 914, it can alternatively include only a single BB processor 913 or only a single RF circuit 914.

Moreover, in addition to supporting the cellular communication method, the radio communication interface 912 can also support other types of radio communication methods such as the near field communication method, the proximity radio communication method, and the wireless LAN (Local Area Network) method. In that case, the radio communication interface 912 can include the BB processors 913 and the RF circuits 914 separately for each radio communication method.

Each antenna switch 915 switches the connection destinations of the antennas 916 among a plurality of circuits included in the radio communication interface 912 (for example, the circuits meant for different radio communication methods).

Each antenna 916 includes one or more antenna elements (for example, a plurality of antenna elements constituting a MIMO antenna), and is used by the radio communication interface 912 in transmitting and receiving radio signals. The smartphone 900 can include a plurality of antennas 916 as illustrated in FIG. 15. Meanwhile, in the example illustrated in FIG. 15, although the smartphone 900 includes a plurality of antennas 916, it can alternatively include only a single antenna 916.

Moreover, the smartphone 900 can include the antennas 916 separately for each radio communication method. In that case, the antenna switch 915 can be omitted from the configuration of the smartphone 900.

The bus 917 connects the processor 901, the memory 902, the storage 903, the external connection interface 904, the camera 906, the sensor 907, the microphone 908, the input device 909, the display device 910, the speaker 911, the radio communication interface 912, and the auxiliary controller 919 to each other. The battery 918 supplies electrical power to each block of the smartphone 900, which is illustrated in FIG. 15, via a power supply line that is partially illustrated in FIG. 15 using dashed lines. The auxiliary controller 919 implements the minimum required functions of the smartphone 900 in, for example, the sleep mode.

Second Application Example

Figure 16:
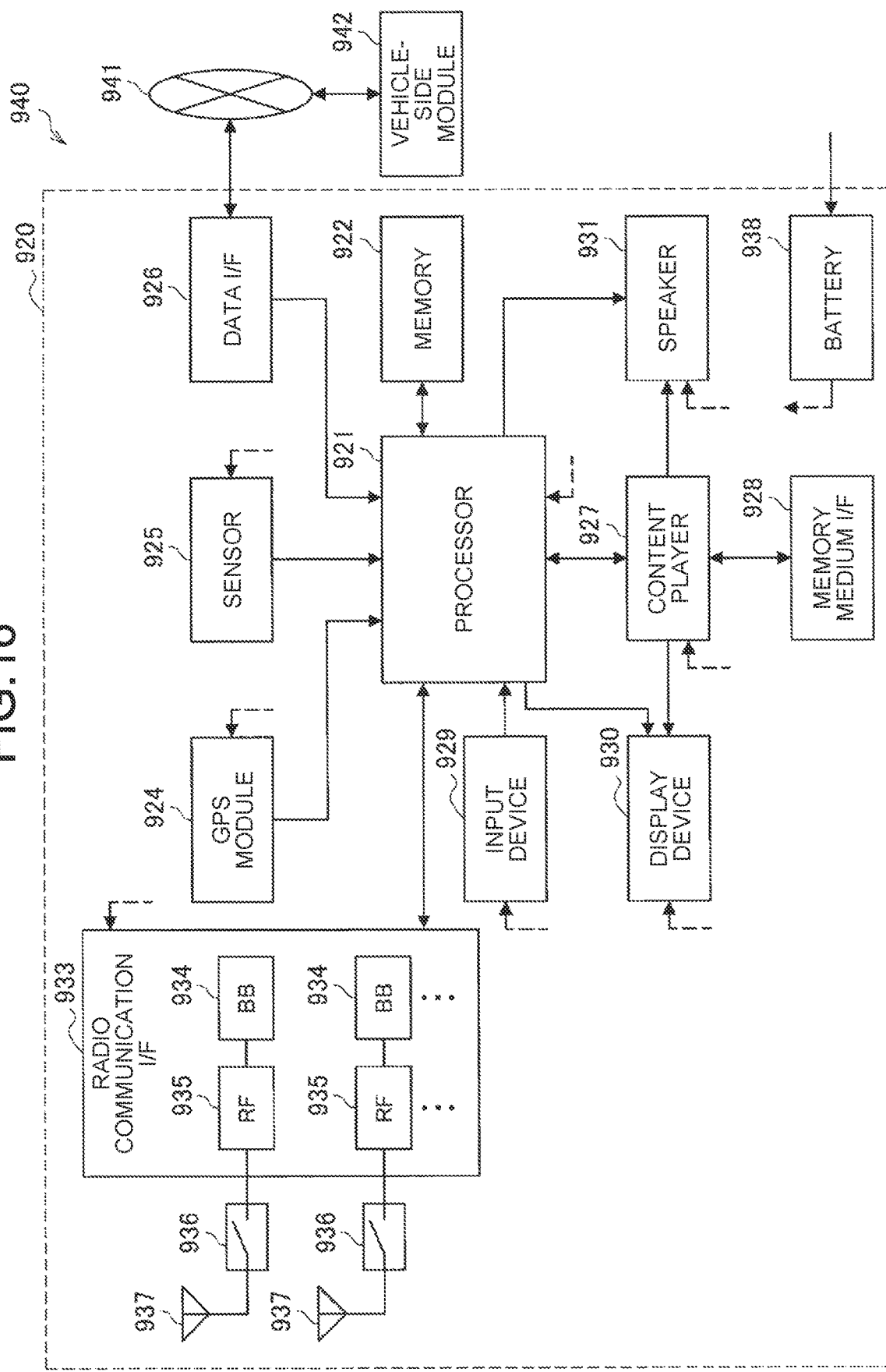
FIG. 16 is a block diagram illustrating an exemplary schematic configuration of a car navigation device 920.

FIG. 16 is a block diagram illustrating an exemplary schematic configuration of a car navigation device 920 in which the technology disclosed in the application concerned is applicable. The car navigation device 920 includes a processor 921, a memory 922, a GPS (Global Positioning System) module 924, a sensor 925, a data interface 926, a content player 927, a memory medium interface 928, an input device 929, a display device 930, a speaker 931, a radio communication interface 933, one or more antenna switches 936, one or more antennas 937, and a battery 938.

The processor 921 can be, for example, a CPU or an SoC, and controls the navigation function and the other functions of the car navigation device 920. The memory 922 includes a RAM and a ROM, and is used to store the programs executed by the processor 921 and to store data.

The GPS module 924 uses GPS signals received from GPS satellites, and measures the location (for example, the latitude, the longitude, and the altitude) of the car navigation device 920. The sensor 925 can include a group of sensors such as a gyro sensor, a geomagnetic sensor, and a pressure sensor. The data interface 926 is connected to, for example, an in-vehicle network 941 via a terminal (not illustrated), and obtains data such as vehicle speed data generated in the vehicle.

The content player 927 reproduces the contents stored in a memory medium (such as a CD or a DVD) that is inserted in the memory medium interface 928. The input device 929 includes a touch sensor for detecting a touch on the screen of the display device 930, and includes buttons or switches; and receives operations and information input from the user. The display device 930 has a screen such as an LCD or an OLED display, and displays a screen of the navigation function or a screen of the reproduced contents. The speaker 931 converts the sounds of the navigation function or the sounds of the reproduced contents.

The radio communication interface 933 supports any one cellular communication method such as the LTE or the LTE-Advanced, and implements radio communication. Typically, the radio communication interface 933 can include a BB processor 934 and an RF circuit 935. The BB processor 934 can perform, for example, encoding/decoding, modulation/demodulation, and multiplexing/inverse multiplexing; and performs a variety of signal processing for radio communication. The RF circuit 935 can include a mixer, a filter, and an amplifier; and transmits and receives radio signals via the antennas 937. Meanwhile, the radio communication interface 933 can be a one-chip module in which the BB processor 934 and the RF circuit 935 are integrated. Moreover, the radio communication interface 933 can include a plurality of BB processors 934 and a plurality of RF circuits 935 as illustrated in FIG. 16. Meanwhile, in the example illustrated in FIG. 16, although the radio communication interface 933 includes a plurality of BB processors 934 and a plurality of RF circuits 935, it can alternatively include only a single BB processor 934 or only a single RF circuit 935.

Moreover, in addition to supporting the cellular communication method, the radio communication interface 933 can also support other types of radio communication methods such as the near field communication method, the proximity radio communication method, and the wireless LAN method. In that case, the radio communication interface 933 can include the BB processors 934 and the RF circuits 935 separately for each radio communication method.

Each antenna switch 936 switches the connection destinations of the antennas 937 among a plurality of circuits included in the radio communication interface 933 (for example, the circuits meant for different radio communication methods).

Each antenna 937 includes one or more antenna elements (for example, a plurality of antenna elements constituting a MIMO antenna), and is used by the radio communication interface 933 in transmitting and receiving radio signals. The car navigation device 920 can include a plurality of antennas 937 as illustrated in FIG. 16. Meanwhile, in the example illustrated in FIG. 16, although the car navigation device 920 includes a plurality of antennas 937, it can alternatively include only a single antenna 937.

Moreover, the car navigation device 920 can include the antennas 937 separately for each radio communication method. In that case, the antenna switch 936 can be omitted from the configuration of the car navigation device 920.

The battery 938 supplies electrical power to each block of the car navigation device 920, which is illustrated in FIG. 16, via a power supply line that is partially illustrated in FIG. 16 using dashed lines. Moreover, the battery 938 stores the electrical power supplied from the vehicle.

Meanwhile, the technology disclosed in the application concerned can be implemented as an in-vehicle system (or a vehicle) 940 that includes one or more blocks of the car navigation device 920; the in-vehicle network 941; and a vehicle-side module 942. The vehicle-side module 942 generates vehicle data such as the vehicle speed, the engine rotation count, and breakdown information; and outputs the generated data to the in-vehicle network 941.

<2.2 Vehicle Control System>

For example, the coupler module 140 according to the embodiment can be implemented as a mobile object control device that is mounted in any type of mobile object such as an automobile, an electrical vehicle, a hybrid electrical vehicle, a motorcycle, a bicycle, a personal mobility, an airplane, a drone, a marine vessel, a robot, a construction equipment, or an agricultural machine (a tractor).

Figure 17:
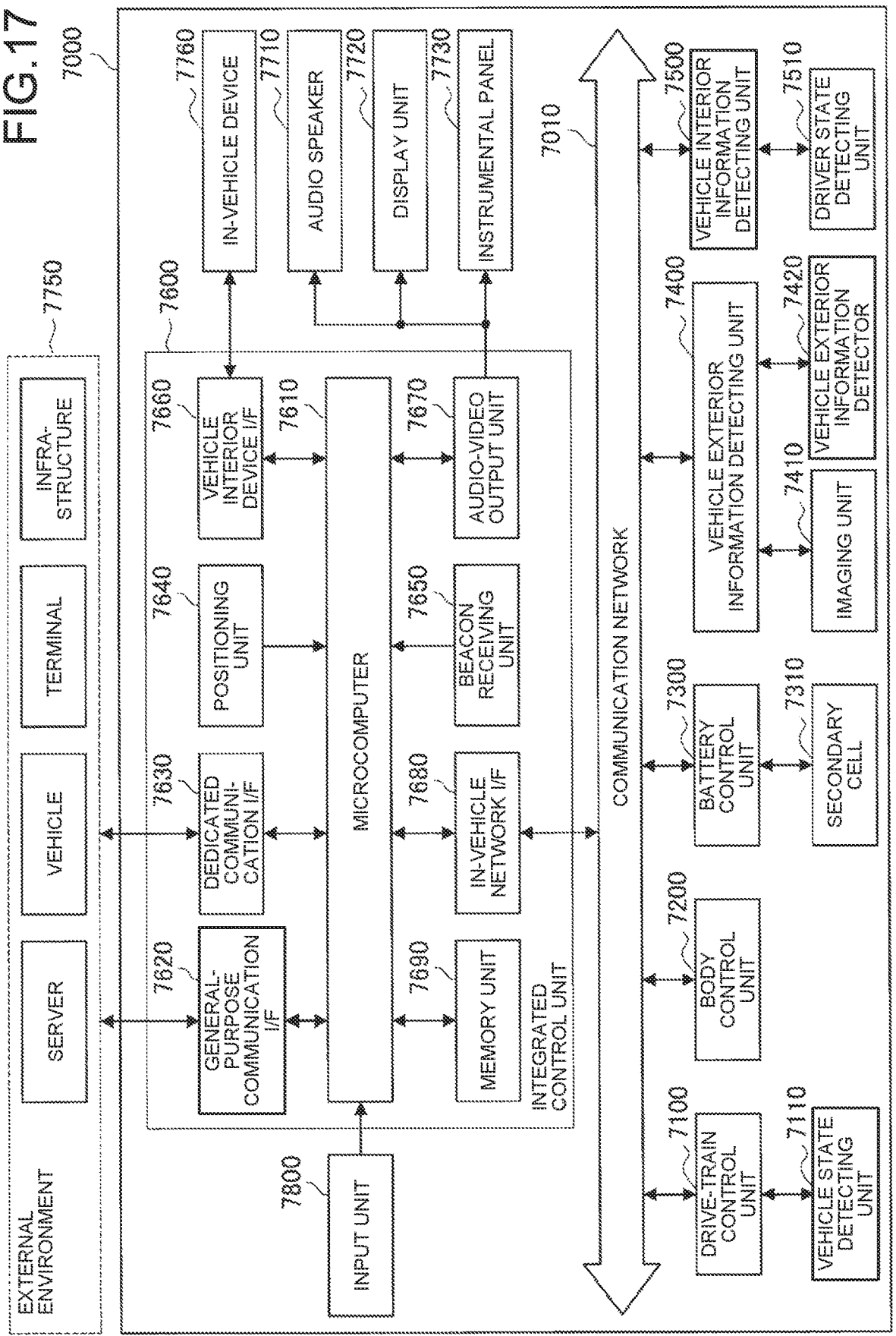
FIG. 17 is a block diagram illustrating an exemplary schematic configuration of a vehicle control system 7000.

FIG. 17 is a block diagram illustrating an exemplary schematic configuration of a vehicle control system 7000 representing an example of a mobile object control system in which the technology disclosed in the application concerned is applicable. The vehicle control system 7000 includes a plurality of electronic control units that are connected to each other via a communication network 7010. In the example illustrated in FIG. 17, the vehicle control system 7000 includes a drive-train control unit 7100, a body control unit 7200, a battery control unit 7300, a vehicle exterior information detecting unit 7400, a vehicle interior information detecting unit 7500, and an integrated control unit 7600. The communication network 7010 that connects such a plurality of control units can be an in-vehicle communication network compatible to an arbitrary standard, such as a CAN (Controller Area network), a LIN (Local Interconnect Network), a LAN, or FlexRay (registered trademark).

Each control unit includes a microcomputer for performing arithmetic processing according to various programs; a memory unit for storing the programs to be executed in the microcomputer and for storing the parameters to be used in a variety of arithmetic processing; and a drive circuit that drives various target devices for control. Moreover, each control unit includes a network I/F for performing communication with the other control units via the communication network 7010, and includes a communication I/F for performing wired communication or wireless communication with devices or sensors installed inside or outside the concerned vehicle. With reference to FIG. 17, a functional configuration of the integrated control unit 7600 includes a microcomputer 7610, a general-purpose communication I/F 7620, a dedicated communication I/F 7630, a positioning unit 7640, a beacon receiving unit 7650, a vehicle interior device I/F 7660, an audio-video output unit 7670, an in-vehicle network I/F 7680, and a memory unit 7690. In an identical manner, the other control units too include a microcomputer, a communication I/F, and a memory unit.

The drive-train control unit 7100 follows instructions from various programs and controls the operations of the devices related to the drive-train of the vehicle. For example, the drive-train control unit 7100 functions as a control device for the following: a drive force generating device, such as the internal-combustion engine or the drive motor, that generates the drive force of the vehicle; a drive force transmission mechanism that transmits the drive force to the wheels; a steering mechanism that adjusts the steering angle of the vehicle; and a braking device that generates the braking force of the vehicle. The drive-train control unit 7100 can also have the functions as a control device for the ABS (Antilock Brake System) or the ESC (Electronic Stability Control).

To the drive-train control unit 7100, a vehicle state detecting unit 7110 is connected. The vehicle state detecting unit 7110 includes, for example, at least either a gyro sensor for detecting the angular velocity of the shaft rotation movement of the vehicle body; or an accelerator sensor for detecting acceleration of the vehicle; or a sensor for detecting the amount of operation of the acceleration pedal, detecting the amount of operation of the brake pedal, detecting the angle of steering of the steering wheel, or detecting the engine speed or the wheel revolution speed. The drive-train control unit 7100 performs arithmetic operations using the signals input from the vehicle state detecting unit 7110, and controls the internal-combustion engine, the drive motor, the electronic power steering device, and the braking device.

The body control unit 7200 follows instructions from various programs and controls the operations of various devices that are fit in the vehicle body. For example, the body control unit 7200 functions as a keyless entry system; a smart key system; an automatic-window device; and a control device for various lamps such as the headlamps, the tail lamps, the brake lamps, the turn signal lamps, and the fog lamps. In that case, the body control unit 7200 can receive input of the radio waves transmitted from a portable device substituting the key and receive input of signals of various switches. Upon receiving the input of the radio waves or the signals, the body control unit 7200 controls the door lock device, the automatic-window device, and the lamps of the vehicle.

The battery control unit 7300 follows instructions from various programs and controls a secondary cell 7310 representing the power supply source for the drive motor. For example, to the battery control unit 7300, information such as the battery temperature, the battery output voltage, and the remaining battery capacity is input from a battery device that includes the secondary cell 7310. The battery control unit 7300 performs arithmetic processing using such signals, and controls the temperature adjustment of the secondary cell 7310 and controls the cooling device installed in the battery device.

The vehicle exterior information detecting unit 7400 detects the information on the outside of the vehicle in which the vehicle control system 7000 is installed. For example, to the vehicle exterior information detecting unit 7400, at least either an imaging unit 7410 or a vehicle exterior information detector 7420 is connected. The imaging unit 7410 includes at least either one of a ToF (Time of Flight) camera, a stereo camera, a monocular camera, an infrared camera, and some other camera. The vehicle exterior information detector 7420 includes, for example, at least either an environment sensor for detecting the current weather conditions or meteorological phenomena, or a surrounding information detection sensor for detecting surrounding vehicles, obstacles, and pedestrians around the vehicle in which the vehicle control system 7000 is installed.

The environment sensor can be, for example, at least either a raindrop sensor for detecting the rainy weather, or a fog sensor for detecting the fog, a sunlight sensor for detecting the amount of sunlight, or a snowfall sensor for detecting the snowfall. The surrounding information detection sensor can be at least one of an ultrasonic sensor, a radar device, and a LIDAR (Light Detection and Ranging, Laser Imaging Detection and Ranging) device. The imaging unit 7410 and the vehicle exterior information detector 7420 can be included as independent sensors or devices, or can be included as a device formed by integrating a plurality of sensors and devices.

Figure 18:
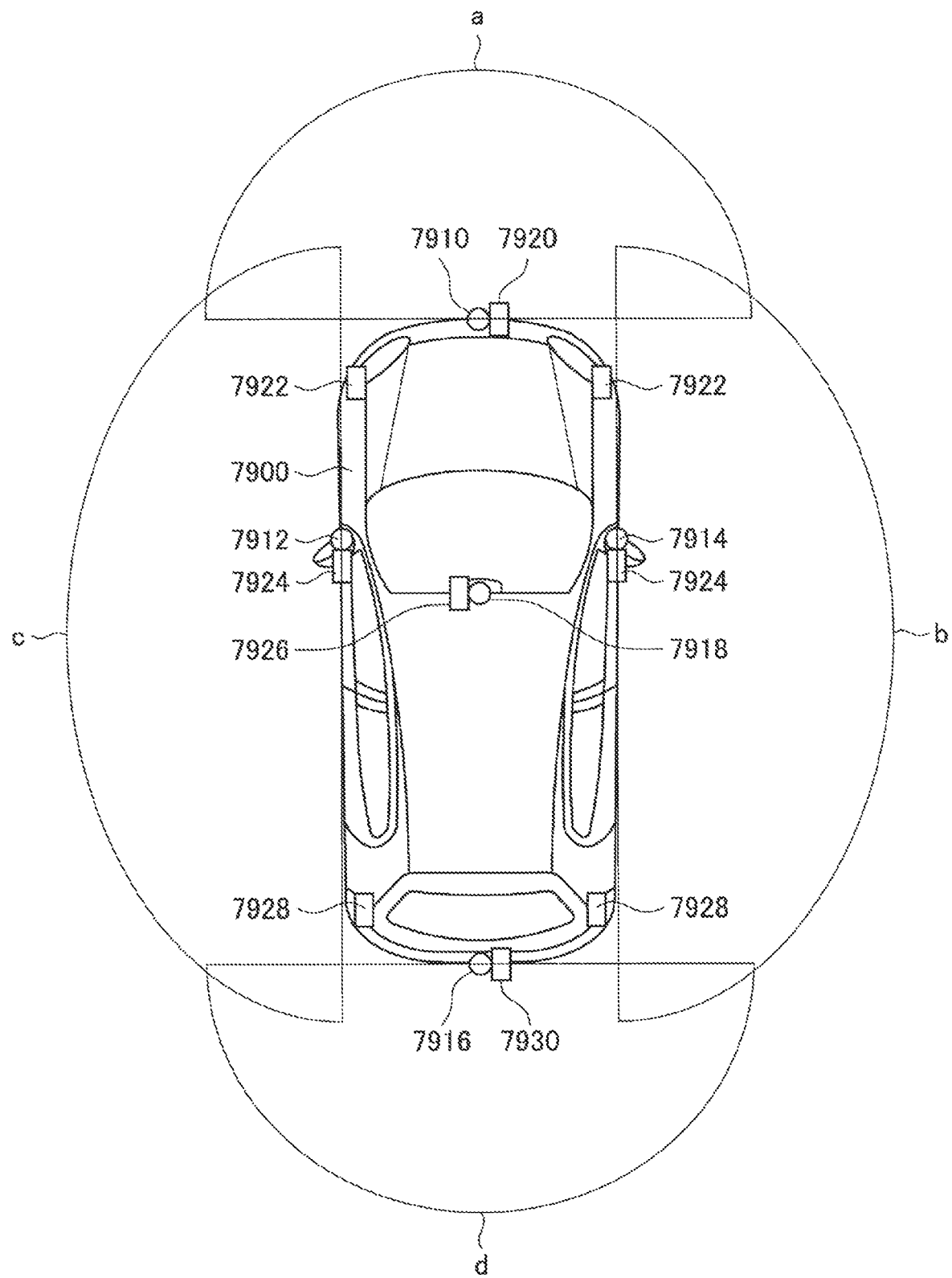
FIG. 18 is an explanatory diagram illustrating an example of the installation positions of an imaging unit 7410 and a vehicle exterior information detector 7420.

In FIG. 18 is illustrated an example of the installation positions of the imaging unit 7410 and the vehicle exterior information detector 7420. Herein, for example, imaging units 7910, 7912, 7914, 7916, and 7918 are installed at least at the front nose, rearview mirrors, the rear bumper, back doors, and the upper part of the windshield on the vehicle interior. The imaging unit 7910 installed on the front nose and the imaging unit 7918 installed in the upper part of the windshield on the vehicle interior mainly obtain the images of the anterior side of a vehicle 7900. The imaging units 7912 and 7914 installed on the rearview mirrors mainly obtain the images of the sides of the vehicle 7900. The imaging unit 7916 installed on the rear bumper or on a back door mainly obtains the images of the posterior side of the vehicle 7900. The imaging unit 7918 installed in the upper part of the windshield on the vehicle interior is mainly used in the detection of leading vehicles, pedestrians, obstacles, traffic lights, traffic signs, and traffic lanes.

Meanwhile, in FIG. 18 is illustrated an example of the imaging range of each of the imaging units 7910, 7912, 7914, and 7916. An imaging range "a" represents the imaging range of the imaging unit 7910 installed on the front nose; imaging ranges "b" and "c" represent the imaging ranges of the imaging units 7912 and 7914, respectively, installed on the rearview mirrors; and an imaging range "d" represents the imaging range of the imaging unit 7916 installed on the rear bumper or a back door. For example, if the image data obtained by imaging by the imaging units 7910, 7912, 7914, and 7916 is superimposed; an overhead image is obtained in which the vehicle 7900 is seen from above.

In the vehicle 7900, vehicle exterior information detectors 7920, 7922, 7924, 7926, 7928, and 7930 that are installed at the front side, the rear side, the lateral sides, the corners, and the upper part of the windshield in the vehicle interior can be, for example, ultrasonic sensors or radar devices. The vehicle exterior information detectors 7920, 7926, and 7930 that are installed at the front nose, the rear bumper, the back doors, and the upper part of the windshield on the vehicle interior can be, for example LIDAR devices. These vehicle exterior information detectors 7920 to 7930 are mainly used in the detection of leading vehicles, pedestrians, and obstacles.

Returning to the explanation with reference to FIG. 17, the vehicle exterior information detecting unit 7400 makes the imaging unit 7410 take images of the vehicle exterior, and receives the image data of the taken images. Moreover, the vehicle exterior information detecting unit 7400 receives detection information from the vehicle exterior information detector 7420 connected thereto. If the vehicle exterior information detector 7420 is an ultrasonic sensor, a laser device, or a LIDAR device; the vehicle exterior information detecting unit 7400 transmits ultrasonic waves or electromagnetic waves, and receives information about the reflected waves. Then, based on the received information, the vehicle exterior information detecting unit 7400 can perform an object detection operation or a distance detection operation for detecting persons, vehicles, obstacles, traffic signs, and on-road characters. Moreover, based on the received information, the vehicle exterior information detecting unit 7400 can perform an environment recognition operation for recognizing rainfall, fog, and road conditions. Furthermore, based on the received information, the vehicle exterior information detecting unit 7400 can calculate the distance to the objects present on the outside of the vehicle.

Moreover, based on the received image data, the vehicle exterior information detecting unit 7400 can perform an image recognition operation or a distance detection operation for recognizing persons, vehicles, obstacles, traffic signs, and on-road characters. Furthermore, the vehicle exterior information detecting unit 7400 can perform operations such as distortion correction or position adjustment with respect to the received image data; synthesize the image data obtained by imaging by different imaging units 7410; and generate an overhead image or a panoramic image. Moreover, the vehicle exterior information detecting unit 7400 can perform a viewpoint conversion operation using the image data obtained by imaging by different imaging units 7410.

The vehicle interior information detecting unit 7500 detects the information about the inside of the vehicle. For example, to the vehicle interior information detecting unit 7500 is connected a driver state detecting unit 7510 that detects the state of the driver. The driver state detecting unit 7510 can include a camera for taking images of the driver, a biological sensor for detecting the biological information of the driver, and a microphone for collecting the sounds inside the vehicle. The biological sensor is disposed in, for example, the seat or the steering wheel, and detects the biological information of the person sitting in the seat or the driver holding the steering wheel. Based on the detection information input from the driver state detecting unit 7510, the vehicle interior information detecting unit 7500 can calculate the degree of tiredness or the degree of concentration of the driver, or can determine whether the driver is asleep at the wheel. Moreover, the vehicle interior information detecting unit 7500 can perform operations such as noise cancelling with respect to the collected sound signals.

The integrated control unit 7600 follows instructions from various programs and controls the overall operations performed in the vehicle control system 7000. To the integrated control unit 7600, an input unit 7800 is connected. For example, the input unit 7800 is implemented using devices such as a touch-sensitive panel, buttons, a microphone, switches, or levers that are operable by the passengers. To the integrated control unit 7600, data can be input that is obtained as a result of performing voice recognition of the voice input from a microphone. The input unit 7800 can be, for example, a remote control device in which infrared rays or some other radio waves are used, or an external connection device such as a cellular phone or a PDA (Personal Digital Assistant) compatible with the operations of the vehicle control system 7000. Alternatively, for example, the input unit 7800 can be a camera, and the passengers can input information using gestures. Still alternatively, data can be input that is obtained by detecting the movements of the wearable devices being worn by the passengers. Moreover, the input unit 7800 can include, for example, an input control circuit that generates input signals based on the information input by the passengers from the input unit 7800, and outputs the input signals to the integrated control unit 7600. The passengers operate the input unit 7800, and input a variety of data and instruct operations to the vehicle control system 7000.

The memory unit 7690 can include a ROM (Read Only Memory) used to store various programs to be executed by the microcomputer, and a RAM (Random Access Memory) used to store various parameters, computational results, and sensor values. The memory unit 7690 can be implemented using a magnetic memory device such as an HDD (Hard Disc Drive), or a semiconductor memory device, or an optical memory device, or a magneto-optical memory device.

The general-purpose communication I/F 7620 is a general-purpose communication I/F for relaying communication with various devices present in an external environment 7750. The general-purpose communication I/F 7620 can be installed with a cellular communication protocol such as GSM (registered trademark) (Global System of Mobile Communications), WiMAX (registered trademark), LTE (registered trademark), or LTE-A (LTE-Advanced); or can be installed with some other wireless communication protocol such as a wireless LAN (also called Wi-Fi (registered trademark)) or Bluetooth (registered trademark). Moreover, the general-purpose communication I/F 7620 can establish connection with devices (for example, application servers and control servers) present in an external network (for example, the Internet, a cloud network, or a network dedicated to business operators) via, for example, a base station or an access point. Furthermore, the general-purpose communication I/F 7620 can establish connection with terminals present in the vicinity of the vehicle (for example, terminals in possession of the driver, pedestrians, and shops) or with MTC terminals using, for example, the P2P (Peer to Peer) technology.

The dedicated communication I/F 7630 is a communication I/F that supports a communication protocol developed for the use in vehicles. For example, the dedicated communication I/F 7630 can implement WAVE (Wireless Access in Vehicle Environment) or DSRC (Dedicated Short Range Communications) representing a combination of IEEE 802.11p for lower layers and IEEE 1609 for upper layers; or can implement a standard protocol such as a cellular communication protocol. Typically, the dedicated communication I/F 7630 carries out V2X communication that is a concept including one or more of vehicle to vehicle communication, vehicle to infrastructure communication, vehicle to home communication, and vehicle to pedestrian communication.

The positioning unit 7640 performs positioning by receiving GNSS signals from GNSS satellites (GNSS stands for Global Navigation Satellite System) (for example, GPS signals from GPS satellites); and generates location information containing the latitude, the longitude, and the altitude of the vehicle. The positioning unit 7640 can identify the current location by exchanging signals with wireless access points, or can obtain location information from a terminal such as a cellular phone, a PHS, or a smartphone having the positioning function.

The beacon receiving unit 7650 receives the radio waves or the electromagnetic waves transmitted from the wireless stations installed on the roads; and obtains information such as the current location, congestion, road closure, and the required time. Meanwhile, the functions of the beacon receiving unit 7650 can alternatively be included in the dedicated communication I/F 7630.

The vehicle interior device I/F 7660 is a communication interface for relaying the connection between the microcomputer 7610 and various in-vehicle devices 7760 present in the vehicle. The vehicle interior device I/F 7660 can establish a wireless connection using a wireless communication protocol such as a wireless LAN, Bluetooth (registered trademark), NFC (Near Field Communication), or WUSB (Wireless USB). Alternatively, the vehicle interior device I/F 7660 can establish a wired connection such as USB (Universal Serial Bus), HDMI (registered trademark) (High-Definition Multimedia Interface), or MHL (Mobile High-definition Link) via a connection terminal (not illustrated) (and a cable if necessary). For example, the in-vehicle devices 7760 can include at least one of the following: mobile devices or wearable devices in possession of the passengers, and information devices carried in or attached to the vehicle. Moreover, the in-vehicle devices 7760 can include a navigation device for searching the routes to an arbitrary destination. The vehicle interior device I/F 7660 exchanges control signals or data signals with the in-vehicle devices 7760.

The in-vehicle network I/F 7680 is an interface for relaying communication with the microcomputer 7610 and the communication network 7010. The in-vehicle network I/F 7680 sends and receives signals according to a predetermined protocol supported by the communication network 7010.

The microcomputer 7610 of the integrated control unit 7600 controls the vehicle control system 7000 according to various protocols and based on the information obtained via at least one of the general-purpose communication I/F 7620, the dedicated communication I/F 7630, the positioning unit 7640, the beacon receiving unit 7650, the vehicle interior device I/F 7660, and the in-vehicle network I/F 7680. For example, based on the obtained information about the inside and the outside of the vehicle, the microcomputer 7610 can calculate control target values of the drive force generating device, the steering mechanism, and the control device; and can output control instructions to the drive-train control unit 7100. For example, the microcomputer 7610 can perform coordinated control with the aim of implementing the functions of the ADAS (Advanced Driver Assistance System) that includes collision avoidance and impact mitigation of the vehicle, follow-travel based on the inter-vehicle distance, speed-maintained travel, warning against collision of vehicles, and warning against lane departure. Moreover, the microcomputer 7610 can control the drive force generating device, the steering mechanism, and the braking device based on the information about the surrounding of the vehicle, and can perform coordinated control with the aim of implementing the self-driving mode in which the vehicle travels in an autonomous manner without the operations of the driver.

The microcomputer 7610 can generate three-dimensional distance information between the vehicle and surrounding objects, such as structures and persons, based the information obtained via at least one of the general-purpose communication I/F 7620, the dedicated communication I/F 7630, the positioning unit 7640, the beacon receiving unit 7650, the vehicle interior device I/F 7660, and the in-vehicle network I/F 7680; and can crate local map information containing the surrounding information of the present location of the vehicle. Moreover, based on the obtained information, the microcomputer 7610 can predict hazards such as collision of vehicles, proximity to pedestrians, or entry into a road having road closure; and can generate warning signals. The warning signals can be, for example, the signals for generating a warning sound or activating a warning lamp.

The audio-video output unit 7670 sends output signals of at least either an audio or an image to output devices capable of notifying the passengers in the vehicle or notifying the outside of the vehicle about information in a visual or auditory manner. In the example illustrated in FIG. 17, an audio speaker 7710, a display unit 7720, and an instrumental panel 7730 are illustrated as the output devices. The display unit 7720 can include, for example, at least either an onboard display or a head-up display. Moreover, the display unit 7720 can also include the AR (Augmented Reality) display function. Apart from such examples, an output device can be a wearable device such as headphones or a spectacle-type display used by the passengers, or can be some other device such as a projector or a lamp. When the output device is a display device, the result of various operations performed by the microcomputer 7610 and the information received from other control units is displayed by the display device in various visual forms such as texts, images, tables, and graphs. When the output device is an audio output device; it converts audio signals, which are made of reproduced audio data or acoustic data, into analog signals, and outputs them in an auditory manner.

In the example illustrated in FIG. 17, of the control units connected via the communication network 7010, at least two control units can be integrated into a single control unit. Alternatively, individual control units can be configured using a plurality of control units. Moreover, the vehicle control system 7000 can include some other control units (not illustrated). Furthermore, in the explanation given above, some or all of the functions of any control unit can be provided in another control unit. That is, as long as the information can be received and sent via the communication network 7010, predetermined arithmetic processing can be performed in any control units. In an identical manner, the sensors or the devices that are connected to a control unit can be connected to another control unit, and a plurality of control units can send detection information to and receive detection information from each other via the communication network 7010.

The coupler module 140 according to the embodiment can be embedded in a measurement device such as a network analyzer that measures high-frequency signals and noise, or can be included in a measurement component that is usable along with a measurement device. Moreover, the coupler module 140 according to the embodiment can be embedded in a semiconductor device, a semiconductor module, or an antenna module used in radio communication. Furthermore, the coupler module 140 according to the embodiment can be used in taking measures against noise (EMI (Electro Magnetic Interference) or EMC (Electro Magnetic Compatibility)).

<<3. Supplementary Explanation>>

Although the application concerned is described above in detail in the form of an embodiment with reference to the accompanying drawings; the technical scope of the application concerned is not limited to the embodiment described above. That is, the application concerned is to be construed as embodying all modifications such as other embodiments, additions, alternative constructions, and deletions that may occur to one skilled in the art that fairly fall within the basic teaching herein set forth.

The effects described according to the embodiment of the present written description are only explanatory and exemplary, and are not limited in scope. That is, the technology disclosed in the application concerned enables achieving other effects that may occur to one skilled in the art.

Meanwhile, a configuration as explained below also falls within the technical scope of the application concerned.

(1)

A directional coupler comprising:
a primary line that transmits signals from a first terminal to a second terminal;
a secondary line that gets coupled with the primary line and draws some of the signals into a third terminal;
a first switching unit that switches connection destination of the third terminal between one end of the secondary line and other end thereof;
a first impedance regulating unit that is installed in between one end of the secondary line and ground, and that changes impedance according to frequency of the signals;
a second impedance regulating unit that is installed in between other end of the secondary line and the ground, and changes impedance according to frequency of the signals; and
a resonance circuit that is installed in between the first switching unit and the third terminal, and that changes impedance of the third terminal according to frequency of the signals.

(2)

The directional coupler according to (1), wherein the resonance circuit includes
a coupling planarization unit that is electrically connected in series in between the first switching unit and the third terminal, and
a matching regulator unit that is electrically connected in parallel in between the first switching unit and the third terminal.

(3)

The directional coupler according to (2), wherein the matching regulator unit regulates impedance of the third terminal according to frequency of the signals.

(4)

The directional coupler according to (2) or (3), wherein the matching regulator unit includes
a first matching regulator unit that corresponds to the signals having frequency in a second frequency band,
a second matching regulator unit that corresponds to the signals having frequency in a third frequency band which includes higher frequencies as compared to the second frequency band, and
a second switching unit that switches connection destination of the third terminal between the first matching regulator unit and the second matching regulator unit.

(5)

The directional coupler according to (4), wherein the matching regulator unit further includes a ground conducting unit that connects the third terminal to the ground.

(6)

The directional coupler according to (5), wherein at least either the first matching unit, or the second matching unit, or the ground connecting unit includes at least either a resistor, or an inductor, or a capacitor.

(7)

The directional coupler according to (6), wherein at least either the first matching regulator unit or the second matching regulator unit includes a resistor and a capacitor connected in series.

(8)

The directional coupler according to (6), wherein at least either the first matching regulator unit or the second matching regulator unit includes a resistor, a capacitor, and an inductor connected in series.

(9)

The directional coupler according to (6), wherein at least either the first matching regulator unit or the second matching regulator unit includes
a resistor, a capacitor, and an inductor connected in parallel, and
a bypass switch that connects both ends of the resistor, the capacitor, and the inductor.

(10)

The directional coupler according to (6), wherein the ground connecting unit includes an inductor and a resistor connected in series.

(11)

The directional coupler according to (6), wherein the ground connecting unit includes
a capacitor and a resistor connected in series, and
a bypass switch that connects both ends of the capacitor.

(12)

The directional coupler according to (2) or (3), wherein the coupling planarization unit performs such adjustment that frequency dependence of coupling characteristic between the first terminal and the third terminal is planarized in a predetermined band.

(13)

The directional coupler according to (4), wherein the coupling planarization unit includes
a first coupling planarization unit that corresponds to the signals having frequency in a first frequency band which includes lower frequencies as compared to the second frequency band,
a second coupling planarization unit that corresponds to the signals having frequencies in the second frequency band and the third frequency band, and
a third switching unit that switches destination connection of the third terminal between the first coupling planarization unit and the second coupling planarization unit.

(14)

The directional coupler according to (13), wherein at least either the first coupling planarization unit or the second coupling planarization unit includes at least either a resistor, or an inductor, or an attenuator.

(15)

The directional coupler according to any one of (1) to (3), wherein each of the first impedance regulating unit and the second impedance regulating unit adjusts isolation characteristic between the third terminal and either the one end or the other end of the secondary line.

(16)

The directional coupler according to (13), wherein each of the first impedance regulating unit and the second impedance regulating unit includes
a first regulating unit that corresponds to the signals having frequency in the first frequency band,
a second regulating unit that corresponds to the signals having frequency in the second frequency band,
a third regulating unit that corresponds to the signals having frequency in the third frequency band, and
a fourth switching unit that switches connection destination of either the one end or the other end of the secondary line among the first regulating unit, the second regulating unit, and the third regulating unit.

(17)

The directional coupler according to (16), wherein at least either the first regulating unit, or the second regulating unit, or the third regulating unit includes at least either a resistor, or an inductor, or a capacitor.

(18)

The directional coupler according to (17), wherein at least either the first regulating unit, or the second regulating unit, or the third regulating unit includes at least a resistor and a capacitor connected in parallel.

(19)

A radio communication device comprising a directional coupler, wherein
the directional coupler includes
a primary line that transmits signals from a first terminal to a second terminal,
a secondary line that gets coupled with the primary line and draws some of the signals into a third terminal,
a first switching unit that switches connection destination of the third terminal between one end of the secondary line and other end thereof,
a first impedance regulating unit that is installed in between one end of the secondary line and ground, and that changes impedance according to frequency of the signals,
a second impedance regulating unit that is installed in between other end of the secondary line and the ground, and changes impedance according to frequency of the signals, and
a resonance circuit that is installed in between the first switching unit and the third terminal, and that changes impedance of the third terminal according to frequency of the signals.

(20)

A control method for a directional coupler that includes
a primary line that transmits signals from a first terminal to a second terminal,
a secondary line that gets coupled with the primary line and draws some of the signals into a third terminal,
a first switching unit that switches connection destination of the third terminal between one end of the secondary line and other end thereof,
a first impedance regulating unit that is installed in between one end of the secondary line and ground, and that changes impedance according to frequency of the signals,
a second impedance regulating unit that is installed in between other end of the secondary line and the ground, and changes impedance according to frequency of the signals, and
a resonance circuit that is installed in between the first switching unit and the third terminal, and that changes impedance of the third terminal according to frequency of the signals,
the control method comprising regulating the first impedance regulating unit, the second impedance regulating unit, and the resonance circuit according to frequency of the signals.

REFERENCE SIGNS LIST 10 radio communication device
28 switching unit
30, 30a, 30f, 30r, 300, 302, 304 terminal part
30FHR, 30FLR, 30FUR, 30RHR, 30RLR, 30RUR, 32LR, 34AR, 34HR, 34R,
34TR, 34UR resistor
30FHC, 30FLC, 30FUC, 30RHC, 30RLC, 30RUC, 34C, 34HC, 34UC capacitor
32, 32a, 320, 322 coupling planarization unit
32HL, 34L, 34TL inductor
32A attenuator
34, 340, 342 matching regulator unit
100 antenna
102 switch
110 LNA
112, 116, 132 BPF
114, 130 mixer
120 control circuit
122 oscillator
132 PA
136 measuring unit
140, 140a coupler module
150 coupler
152, 154 microstrip line
200 regulator circuit
344 ground connecting unit
700 server
701, 901, 921 processor
702, 822, 852, 902, 922 memory
703, 903 storage
704, 823, 853 network interface
705, 7010 radio communication network
706, 917 bus
800 eNB
820, 850 base station device
821, 851 controller
825, 855, 863, 912, 933 radio communication interface
826, 856, 913, 934 BB processor
827, 864, 914, 935 RF circuit
857, 861 connection interface
860 RRH
900 smartphone
904 external connection interface
906, 925 camera
907 sensor
908 microphone
909, 929 input device
910, 930 display device
911, 931 speaker
915, 936 antenna switch
918, 938 battery
919 auxiliary controller
920 car navigation device
923 GPS module
926 data interface
927 content player
928 memory medium interface
940 in-vehicle system
941 in-vehicle network
942 vehicle-side module
7000 vehicle control system
7100 drive-train control unit
7110 vehicle state detecting unit
7200 body control unit
7300 battery control unit
7310 secondary cell
7400 vehicle exterior information detecting unit
7410, 7910, 7912, 7914, 7916, 7918 imaging unit
7420, 7920, 7921, 7922, 7923, 7924, 7925, 7926, 7928, 7929, 7930 vehicle exterior information detector
7500 vehicle interior information detecting unit
7510 driver state detecting unit
7600 integrated control unit 7610 microcomputer
7620 general-purpose communication I/F
7630 dedicated communication I/F
7640 positioning unit
7650 beacon receiving unit
7660 vehicle interior device I/F
7670 audio-video output unit
7680 in-vehicle network I/F
7690 memory unit
7710 audio speaker
7720 display unit
7730 instrumental panel
7750 external environment
7760 in-vehicle device
7800 input unit
7900 vehicle
P1, P2, P3, P5, P6 port
F1, F2, F3a, F3b, F4a, F4b, F5 to F13, F21, F22, F30, F40 switch

The invention claimed is:

1. A directional coupler, comprising:
a primary line that transmits signals from a first terminal to a second terminal;
a secondary line that gets coupled with the primary line and draws some of the signals into a third terminal;
a first switching unit that switches connection destination of the third terminal between one end of the secondary line and other end thereof;
a first impedance regulating unit that is installed in between the one end of the secondary line and ground, and that changes impedance according to frequency of the signals;
a second impedance regulating unit that is installed in between the other end of the secondary line and the ground, and that changes impedance according to the frequency of the signals; and
a resonance circuit that is installed in between the first switching unit and the third terminal, and that changes impedance of the third terminal according to the frequency of the signals, wherein the resonance circuit includes:
a coupling planarization unit that is electrically connected in series in between the first switching unit and the third terminal, wherein the coupling planarization unit performs such adjustment that frequency dependence of coupling characteristic between the first terminal and the third terminal is planarized in a predetermined band, and
a matching regulator unit that is electrically connected in parallel with the coupling planarization unit and in between the first switching unit and the third terminal.

2. The directional coupler according to claim 1, wherein the matching regulator unit regulates impedance of the third terminal according to the frequency of the signals.

3. The directional coupler according to claim 1, wherein the matching regulator unit includes:
a first matching regulator unit that corresponds to the signals having the frequency in a second frequency band,
a second matching regulator unit that corresponds to the signals having the frequency in a third frequency band which includes higher frequencies as compared to the second frequency band, and
a second switching unit that switches connection destination of the third terminal between the first matching regulator unit and the second matching regulator unit.

4. The directional coupler according to claim 3, wherein the matching regulator unit further includes a ground connecting unit that connects the third terminal to the ground.

5. The directional coupler according to claim 4, wherein at least either the first matching regulator unit, or the second matching regulator unit, or the ground connecting unit includes at least either a resistor, or an inductor, or a capacitor.

6. The directional coupler according to claim 5, wherein the ground connecting unit includes an inductor and a resistor connected in series.

7. The directional coupler according to claim 5, wherein the ground connecting unit includes:
a capacitor and a resistor connected in series, and
a bypass switch that bypasses both ends of the capacitor.

8. The directional coupler according to claim 4, wherein at least either the first matching regulator unit or the second matching regulator unit includes a resistor and a capacitor connected in series.

9. The directional coupler according to claim 4, wherein at least either the first matching regulator unit or the second matching regulator unit includes a resistor, a capacitor, and an inductor connected in series.

10. The directional coupler according to claim 4, wherein at least either the first matching regulator unit or the second matching regulator unit includes:
a resistor, a capacitor, and an inductor connected in parallel, and
a bypass switch that connects both ends of the resistor, the capacitor, and the inductor.

11. The directional coupler according to claim 3, wherein the coupling planarization unit includes:
a first coupling planarization unit that corresponds to the signals having the frequency in a first frequency band which includes lower frequencies as compared to the second frequency band,
a second coupling planarization unit that corresponds to the signals having frequencies in the second frequency band and the third frequency band, and
a third switching unit that switches destination connection of the third terminal between the first coupling planarization unit and the second coupling planarization unit.

12. The directional coupler according to claim 11, wherein at least either the first coupling planarization unit or the second coupling planarization unit includes at least either a resistor, or an inductor, or an attenuator.

13. The directional coupler according to claim 11, wherein each of the first impedance regulating unit and the second impedance regulating unit includes:
a first regulating unit that corresponds to the signals having the frequency in the first frequency band,
a second regulating unit that corresponds to the signals having frequency in the second frequency band,
a third regulating unit that corresponds to the signals having frequency in the third frequency band, and
a fourth switching unit that switches connection destination of either the one end or the other end of the secondary line among the first regulating unit, the second regulating unit, and the third regulating unit.

14. The directional coupler according to claim 13, wherein at least either the first regulating unit, or the second regulating unit, or the third regulating unit includes at least either a resistor, or an inductor, or a capacitor.

15. The directional coupler according to claim 13, wherein at least either the first regulating unit, or the second regulating unit, or the third regulating unit includes at least a resistor and a capacitor connected in parallel.

16. The directional coupler according to claim 1, wherein each of the first impedance regulating unit and the second impedance regulating unit adjusts isolation characteristic between the third terminal and either the one end or the other end of the secondary line.

17. A radio communication device comprising a directional coupler, wherein
the directional coupler includes:
a primary line that transmits signals from a first terminal to a second terminal,
a secondary line that gets coupled with the primary line and draws some of the signals into a third terminal,
a first switching unit that switches connection destination of the third terminal between one end of the secondary line and other end thereof,
a first impedance regulating unit that is installed in between the one end of the secondary line and ground, and that changes impedance according to frequency of the signals,
a second impedance regulating unit that is installed in between the other end of the secondary line and the ground, and that changes impedance according to the frequency of the signals, and
a resonance circuit that is installed in between the first switching unit and the third terminal, and that changes impedance of the third terminal according to the frequency of the signals, wherein the resonance circuit includes:
a coupling planarization unit that is electrically connected in series in between the first switching unit and the third terminal, wherein the coupling planarization unit performs such adjustment that frequency dependence of coupling characteristic between the first terminal and the third terminal is planarized in a predetermined band, and
a matching regulator unit that is electrically connected in parallel with the coupling planarization unit and in between the first switching unit and the third terminal.

18. A control method for a directional coupler, the control method comprising:
a primary line that transmits signals from a first terminal to a second terminal,
a secondary line that gets coupled with the primary line and draws some of the signals into a third terminal,
a first switching unit that switches connection destination of the third terminal between one end of the secondary line and other end thereof,
a first impedance regulating unit that is installed in between the one end of the secondary line and ground, and that changes impedance according to frequency of the signals,
a second impedance regulating unit that is installed in between the other end of the secondary line and the ground, and that changes impedance according to the frequency of the signals, and
a resonance circuit that is installed in between the first switching unit and the third terminal, and that changes impedance of the third terminal according to the frequency of the signals, wherein the resonance circuit includes:
a coupling planarization unit that is electrically connected in series in between the first switching unit and the third terminal, wherein the coupling planarization unit performs such adjustment that frequency dependence of coupling characteristic between the first terminal and the third terminal is planarized in a predetermined band, and
a matching regulator unit that is electrically connected in parallel with the coupling planarization unit and in between the first switching unit and the third terminal,
wherein the control method regulates the first impedance regulating unit, the second impedance regulating unit, and the resonance circuit according to the frequency of the signals.

* * * * *